(12) United States Patent
Shen et al.

(10) Patent No.: US 11,558,068 B2
(45) Date of Patent: Jan. 17, 2023

(54) METHOD AND APPARATUS FOR ENCODING POLAR CODE CONCATENATED WITH CRC CODE

(71) Applicant: Huawei Technologies Co., Ltd., Shenzhen (CN)

(72) Inventors: Hui Shen, Shenzhen (CN); Bin Li, Shenzhen (CN); Ling Liu, Shenzhen (CN); Jiaqi Gu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/322,451

(22) Filed: May 17, 2021

(65) Prior Publication Data

US 2021/0273658 A1 Sep. 2, 2021

Related U.S. Application Data

(63) Continuation of application No. PCT/CN2019/127792, filed on Dec. 24, 2019.

(30) Foreign Application Priority Data

Jan. 17, 2019 (CN) .......................... 201910042371.9

(51) Int. Cl.
*H03M 13/00* (2006.01)
*H03M 13/29* (2006.01)
(Continued)

(52) U.S. Cl.
CPC ....... *H03M 13/2906* (2013.01); *H03M 13/09* (2013.01); *H03M 13/13* (2013.01)

(58) Field of Classification Search
CPC ... H03M 13/2906; H03M 13/09; H03M 13/13
See application file for complete search history.

(56) References Cited

U.S. PATENT DOCUMENTS

| 2014/0173376 A1 | 6/2014 | Jeong et al. |
| 2018/0262216 A1* | 9/2018 | Noh ....................... H03M 13/13 |

(Continued)

FOREIGN PATENT DOCUMENTS

| CN | 109120376 A | 1/2019 |
| CN | 109150383 A | 1/2019 |

(Continued)

OTHER PUBLICATIONS

R1-1705756, NTT DOCOMO, "CRC related design of Polar codes," 3GPP TSG RAN WG1 Meeting #88bis, Spokane, USA, Apr. 3-7, 2017, 6 pages.

(Continued)

*Primary Examiner* — Samir W Rizk
(74) *Attorney, Agent, or Firm* — Conley Rose, P.C.

(57) ABSTRACT

A method and an apparatus for encoding a polar code concatenated with a cyclic redundancy check (CRC), where M bits are selected from K bits in the sequence to perform CRC encoding. The M bits are determined based on reliability of K polarized subchannels on which the K bits are placed and/or row weights of K rows, in a first matrix, corresponding to the K polarized subchannels on which the K bits are placed. The first matrix is an encoding matrix of polar encoding. Polar encoding is performed on the K bits and obtained CRC check bits. An encoded codeword is output.

20 Claims, 11 Drawing Sheets

(51) Int. Cl.
*H03M 13/09* (2006.01)
*H03M 13/13* (2006.01)

(56) References Cited

U.S. PATENT DOCUMENTS

2020/0136650 A1 4/2020 Huang et al.
2020/0313698 A1* 10/2020 Jeong .................... H04L 1/0041
2021/0328716 A1* 10/2021 Noh .......................... H04L 1/00

FOREIGN PATENT DOCUMENTS

WO 2019000190 A1 1/2019
WO 2019073403 A1 4/2019

OTHER PUBLICATIONS

3GPP TS 38.212 V15.4.0, "3rd Generation Partnership Project; Technical Specification Group Radio Access Network; NR; Multiplexing and channel coding (Release 15)," Dec. 2018, 100 pages.
Li, G., et al., "Low Complexity Successive Cancellation List Decoding of CRC-Aided Polar Codes," ICIC Express Letters, vol. 8, No. 12, Dec. 2014, XP009530437, 8 pages.
Zhou, H., et al., "Segmented CRC-Aided SC List Polar Decoding," 2016 IEEE 83rd Vehicular Technology Conference (VTC Spring), Date of Conference: May 15-18, 2016, XP032918751, 5 pages.
R1-1710490, Ericsson, "CRC-based Polar Code Construction," 3GPP TSG RAN WG1 NR Ad-Hoc#2, Qingdao, P.R. China, Jun. 27-30, 2017, XP051305747, 11 pages.

* cited by examiner

METHOD AND APPARATUS FOR ENCODING POLAR CODE CONCATENATED WITH CRC CODE

CROSS-REFERENCE TO RELATED APPLICATIONS

This application is a continuation of International Patent Application No. PCT/CN2019/127792, filed on Dec. 24, 2019, which claims priority to Chinese Patent Application No. 201910042371.9, filed on Jan. 17, 2019. The disclosures of the aforementioned applications are hereby incorporated by reference in their entireties.

TECHNICAL FIELD

This application relates to the field of communications technologies, and more specifically, to a method and an apparatus for encoding a polar code concatenated with a CRC code.

BACKGROUND

As a most fundamental radio access technology, channel encoding plays a critical role in ensuring reliable data transmission. In an existing wireless communications system, channel encoding is usually performed using a turbo code, a low-density parity-check (LDPC) code, and a polar code. The polar code (which is also referred to as a polarization code) is an encoding scheme based on channel polarization. The polar code is the first and the only well-proved channel encoding method currently that can "reach" a channel capacity. In a case of different code lengths, particularly for a finite code, performance of the polar code is far better than that of the turbo code and the LDPC code. In addition, the polar code has relatively low computational complexity in terms of encoding and decoding. These advantages enable the polar code to have great development and application prospects in the communications field. However, with rapid evolution of a wireless communications system, these communication scenarios have a higher requirement on the performance of the polar code.

SUMMARY

This application provides a method and an apparatus for encoding a polar code concatenated with a cyclic redundancy check (CRC) code, and performance of a polar code concatenated with a CRC code in this method is better than that of a polar code in a conventional concatenation solution.

According to a first aspect, an encoding method is provided, and the method includes: obtaining a bit sequence whose length is K, where the bit sequence includes K bits, and K is a positive integer; performing CRC encoding on M bits in the K bits to obtain L CRC check bits, where both M and L are positive integers, and M is less than K; performing polar encoding on the K bits and the L CRC check bits to obtain an encoded codeword whose length is N, where an encoding matrix of the polar encoding is a first matrix, and the M bits are determined based on reliability of K polarized subchannels on which the K bits are placed or row weights of K rows, in the first matrix, corresponding to the K polarized subchannels on which the K bits are placed, or the M bits are determined based on reliability of K polarized subchannels on which the K bits are placed and row weights of K rows, in the first matrix, corresponding to the K polarized subchannels on which the K bits are placed, where N is 2 raised to the power of a positive integer, K is less than or equal to N, L is less than N, and (K+L) is less than or equal to N; and outputting the encoded codeword.

According to a second aspect, an encoding apparatus is provided, and the apparatus includes: an obtaining unit configured to obtain a bit sequence whose length is K, where the bit sequence includes K bits, and K is a positive integer; a CRC encoding unit configured to perform CRC encoding on M bits in the K bits to obtain L CRC check bits, where both M and L are positive integers, and M is less than K; a polar encoding unit configured to perform polar encoding on the K bits and the L CRC check bits to obtain an encoded codeword whose length is N, where an encoding matrix of the polar encoding is a first matrix, and the M bits are determined based on reliability of K polarized subchannels on which the K bits are placed or row weights of K rows, in the first matrix, corresponding to the K polarized subchannels on which the K bits are placed, or the M bits are determined based on reliability of K polarized subchannels on which the K bits are placed and row weights of K rows, in the first matrix, corresponding to the K polarized subchannels on which the K bits are placed, where N is 2 raised to the power of a positive integer, K is less than or equal to N, L is less than N, and (K+L) is less than or equal to N; and an output unit configured to output the encoded codeword.

According to a third aspect, a decoding method is provided, and the method includes: performing successive cancellation list (SCL) decoding on to-be-decoded information, where the to-be-decoded information includes K to-be-decoded bits; performing CRC check on candidate paths, where there are L CRC check bits, the L CRC check bits are used to check M bits in the K to-be-decoded bits, both M and L are positive integers, and M is less than K, and determining a candidate path on which CRC check succeeds as a decoding result, where the decoding result includes a decoding result of the to-be-decoded information; and outputting the decoding result of the to-be-decoded information, where the M bits are determined based on reliability of K polarized subchannels on which the K bits are placed or row weights of K rows, in a first matrix, corresponding to the K polarized subchannels on which the K bits are placed, and the first matrix is an encoding matrix of polar encoding; or the M bits are determined based on reliability of K polarized subchannels on which the K bits are placed and row weights of K rows, in the first matrix, corresponding to the K polarized subchannels on which the K bits are placed, where N is 2 raised to the power of a positive integer, K is less than or equal to N, L is less than N, and (K+L) is less than or equal to N.

According to a fourth aspect, a decoding apparatus is provided, and the apparatus includes: a decoding unit configured to perform SCL decoding on to-be-decoded information, where the to-be-decoded information includes K to-be-decoded bits; a CRC check unit configured to perform CRC check on candidate paths, where there are L CRC check bits, the L CRC check bits are used to check M bits in the K bits, both M and L are positive integers, and M is less than K, where the CRC check unit is further configured to determine a candidate path on which CRC check succeeds as a decoding result, where the decoding result includes a decoding result of the to-be-decoded information; and an output unit configured to output the decoding result of the to-be-decoded information, where the M bits are determined based on reliability of K polarized subchannels on which the K bits are placed or row weights of K rows, in a first matrix, corresponding to the K polarized subchannels on which the K bits are placed, and the first matrix is an encoding matrix of polar encoding; or the M bits are determined based on reliability of K polarized subchannels on which the K bits are placed and row weights of K rows, in the first matrix, corresponding to the K polarized subchannels on which the K bits are placed, where N is 2 raised to the power of a positive integer, K is less than or equal to N, L is less than N, and (K+L) is less than or equal to N.

With reference to any one of the first aspect to the fourth aspect, in some implementations, the M bits are determined based on the row weights of the K rows, in the first matrix, corresponding to the K polarized subchannels on which the K bits are placed, and the M bits are bits corresponding to M rows with relatively small row weights in the K rows or in (K+L) rows. The first matrix is an encoding matrix of a polar code. Usually, for the polar code, a small row weight of the encoding matrix indicates low reliability of a polarized subchannel, and it is very convenient to determine the reliability of the polarized subchannel using the row weight of the encoding matrix.

With reference to any one of the first aspect to the fourth aspect, in some implementations, the row weights of the M rows corresponding to the M bits are less than or equal to a first threshold. In a possible design, the first threshold is greater than or equal to a minimum value in the row weights of the K rows corresponding to the K bits. In another possible design, the first threshold is determined based on a minimum code distance of the polar code.

With reference to any one of the first aspect to the fourth aspect, in some implementations, the M bits are determined based on the reliability of the K polarized subchannels on which the K bits are placed. In a possible design, the M bits are M bits corresponding to M polarized subchannels with relatively low reliability in the K polarized subchannels on which the K bits are placed. CRC encoding is performed on bits with low channel reliability, and bits with high channel reliability are directly mapped to polarized subchannels. Compared with a conventional concatenation solution with a same CRC code length, this reduces a frame error rate (FER).

With reference to any one of the first aspect to the fourth aspect, in some implementations, the M bits are determined based on the reliability of the K polarized subchannels on which the K bits are placed and the row weights of the K rows, in the first matrix, corresponding to the K polarized subchannels on which the K bits are placed. In a possible design, the step of determining the M bits includes: determining M1 bits corresponding to rows, in the first matrix, whose row weights are less than or equal to a first threshold, where M1 is greater than or equal to M, and M1 is a positive integer; and determining the M bits from the M1 bits, where the M bits are M bits corresponding to relatively low polarized subchannel reliability in the M1 bits.

With reference to any one of the first aspect to the fourth aspect, in some implementations, the M bits are determined based on the reliability of the K polarized subchannels on which the K bits are placed and the row weights of the K rows, in the first matrix, corresponding to the K polarized subchannels on which the K bits are placed. In a possible design, the step of determining the M bits includes: determining M2 bits from the K bits, where the M2 bits are M2 bits corresponding to relatively low polarized subchannel reliability in the K bits, M2 is greater than or equal to M, and M2 is a positive integer; and determining the M bits from the M2 bits, where row weights of M rows corresponding to the M bits are less than or equal to a second threshold.

With reference to any one of the first aspect to the fourth aspect, in some implementations, the M bits corresponding to the M polarized subchannels with the relatively low reliability are determined according to a table or a sequence that represents reliability, or a reliability order of M1 polarized subchannels of the M1 bits is determined according to a table or a sequence that represents reliability.

With reference to any one of the first aspect to the fourth aspect, in some implementations, the M bits corresponding to the M polarized subchannels with the relatively low reliability are determined based on a capacity (I(W)), or a reliability order of M1 polarized subchannels of the M1 bits is determined based on a capacity (I(W)).

With reference to any one of the first aspect to the fourth aspect, in some implementations, the M bits corresponding to the M polarized subchannels with the relatively low reliability are determined based on a Bhattacharyya parameter (Z(W)), or a reliability order of M1 polarized subchannels of the M1 bits is determined based on a Bhattacharyya parameter (Z(W)).

With reference to any one of the first aspect to the fourth aspect, in some implementations, the M bits corresponding to the M polarized subchannels with the relatively low reliability are determined based on an error probability (P(W)), or a reliability order of M1 polarized subchannels of the M1 bits is determined based on an error probability (P(W)).

According to a fifth aspect, an encoding apparatus is provided, and the apparatus includes: a processor configured to execute a program stored in a memory, where when the program is executed, the apparatus is enabled to perform the method in the first aspect or all implementations of the first aspect.

With reference to the fifth aspect, in some implementations, the memory is located in the apparatus.

With reference to the fifth aspect, in some implementations, the memory is integrated with the processor.

With reference to the fifth aspect, in some implementations, the memory is located outside the apparatus.

With reference to the fifth aspect, in some implementations, the apparatus is a base station or a terminal.

With reference to the fifth aspect, in some implementations, the apparatus is a chip or an integrated circuit.

According to a sixth aspect, this application provides a computer-readable storage medium. The computer-readable storage medium stores a computer program instruction. When the instruction is run on a computer, the computer is enabled to perform the method in any one of the first aspect or the possible implementations of the first aspect, or the second aspect or the possible implementations of the second aspect.

According to a seventh aspect, this application provides a computer program product. The computer program product includes computer program code. When the computer program code is run on a computer, the computer is enabled to perform the method in any one of the first aspect or the possible implementations of the first aspect, or the second aspect or the possible implementations of the second aspect.

According to an eighth aspect, a polar encoding apparatus is provided. The apparatus has functions of implementing the method in any one of the first aspect or the possible designs of the first aspect. The functions may be implemented by hardware, or may be implemented by hardware executing corresponding software. The hardware or the software includes one or more modules corresponding to the functions.

In a possible implementation, the polar encoding apparatus includes a processor configured to perform the method in any one of the first aspect or the possible designs of the first aspect.

Optionally, the polar encoding apparatus further includes a storage unit configured to store data generated or used in a process in which the processor performs the method in any one of the first aspect or the possible designs of the first aspect.

Optionally, the storage unit may be located outside the encoding apparatus, or may be a physically independent unit, or may be storage space or a network hard disk on a cloud server.

Optionally, the polar encoding apparatus may be a chip or an integrated circuit.

In a possible implementation, when some or all of the functions are implemented by hardware, the polar encoding apparatus includes an input interface configured to obtain a bit sequence; an encoding circuit configured to perform a step other than obtaining and output steps in the method in any one of the first aspect or the possible designs of the first aspect; and an output interface configured to output an encoded codeword.

Optionally, the polar encoding apparatus may be a chip or an integrated circuit.

According to a ninth aspect, a communications system is provided. The communications system includes a network device and a terminal, and the network device or the terminal may perform the method in any one of the first aspect or the possible designs of the first aspect.

According to a tenth aspect, a wireless device is provided. The device includes a polar encoding apparatus and a transceiver that are configured to implement any one of the first aspect or the possible designs of the first aspect.

The modulator is configured to modulate a processed encoded codeword to obtain a modulated codeword.

The transceiver is configured to send the modulated codeword.

In a possible implementation, the wireless device is a terminal or a network device.

According to an eleventh aspect, a polar decoding apparatus is provided. The apparatus has functions of implementing the method in any one of the third aspect or the possible designs of the third aspect. The functions may be implemented by hardware, or may be implemented by hardware executing corresponding software. The hardware or the software includes one or more modules corresponding to the functions.

In a possible design, the polar decoding apparatus includes a processor configured to perform the method in any one of the third aspect or the possible designs of the third aspect.

Optionally, the polar decoding apparatus further includes a storage unit configured to store data generated or used in a process in which the processor performs the method in any one of the first aspect or the possible designs of the first aspect.

Optionally, the storage unit may be located outside the encoding apparatus, or may be a physically independent unit, or may be storage space or a network hard disk on a cloud server.

Optionally, the polar decoding apparatus may be a chip or an integrated circuit.

In a possible implementation, when some or all of the functions are implemented by hardware, the polar code encoding apparatus includes: an input interface configured to obtain to-be-decoded bits of a bit sequence whose length is K; a decoding circuit configured to perform a step other than obtaining and output steps in the method in any one of the first aspect or the possible designs of the first aspect; and an output interface configured to output a bit sequence in a decoding result.

Optionally, the polar decoding apparatus may be a chip or an integrated circuit.

According to a twelfth aspect, a communications system is provided. The communications system includes a network device and a terminal, and the network device or the terminal may perform the method in any one of the third aspect or the possible designs of the third aspect.

According to a thirteenth aspect, a wireless device is provided. The device includes a polar decoding apparatus, a demodulator, and a transceiver that are configured to implement any one of the third aspect or the possible designs of the third aspect.

The transceiver receives a modulated codeword.

The demodulator is configured to demodulate the modulated codeword to obtain to-be-decoded information.

In a possible implementation, the wireless device is a terminal or a network device.

In embodiments of this application, the bit sequence for the CRC encoding is selected from a perspective such as the row weights of the encoding matrix (the first matrix), the reliability of the polarized subchannels, comprehensive consideration of the row weights and the reliability, or the like. The method for encoding a polar code concatenated with a CRC check code can be used to obtain better performance.

BRIEF DESCRIPTION OF DRAWINGS

To describe the technical solutions in embodiments of the present disclosure more clearly, the following briefly describes the accompanying drawings for describing the embodiments.

DESCRIPTION OF EMBODIMENTS

The following clearly describes the technical solutions in embodiments of this application with reference to the accompanying drawings in the embodiments of this application. In descriptions of this application, "a plurality of" means two or more than two. In addition, for convenience of clear description of the technical solutions in the embodiments of this application, in the embodiments of this application, terms such as "first", "second", and the like are used to distinguish between same objects or similar objects whose functions and purposes are basically the same. A person skilled in the art may understand that the terms such as "first" and "second" do not limit a quantity and an execution sequence, and the terms such as "first" and "second" do not indicate a definite difference. Another method may be obtained based on steps and procedures or a combination of some of steps and procedures in content provided in the embodiments of this application. Based on these obtained methods and steps, a corresponding apparatus is provided, and the apparatus includes units, modules, means, or a combination thereof for performing a method and steps. A network architecture and a service scenario described in embodiments of this application are intended to describe the technical solutions in the embodiments of this application more clearly, and do not constitute a limitation on the technical solutions provided in the embodiments of this application. A person of ordinary skill in the art may know that with the evolution of the network architecture and the emergence of a new service scenario, the technical solutions provided in the embodiments of this application are also applicable to a similar technical problem. Before the technical solutions in the embodiments of this application are described, a technical scenario in the embodiments of this application is first described with reference to the accompanying drawings.

The embodiments of this application can be applied to a wireless communications system. The wireless communications system mentioned in the embodiments of this application includes but is not limited to a Long-Term Evolution (LTE) system and three application scenarios of a next-generation $5^{th}$ generation (5G) mobile communications system: Enhanced Mobile Broad Band (eMBB), ultra-reliable and low-latency communications (URLLC), and massive machine-type communications (mMTC). Alternatively, the wireless communications system may further be a device-to-device (D2D) communications system, another communications system, a future communications system, or the like.

A communications apparatus mentioned in this application may be configured in a communications device, and the communications device mainly includes a network device or a terminal device. If a transmit end in this application is a network device, a receive end may be a terminal device. If a transmit end in this application is a terminal device, a receive end may be a network device.

Figure 1A:
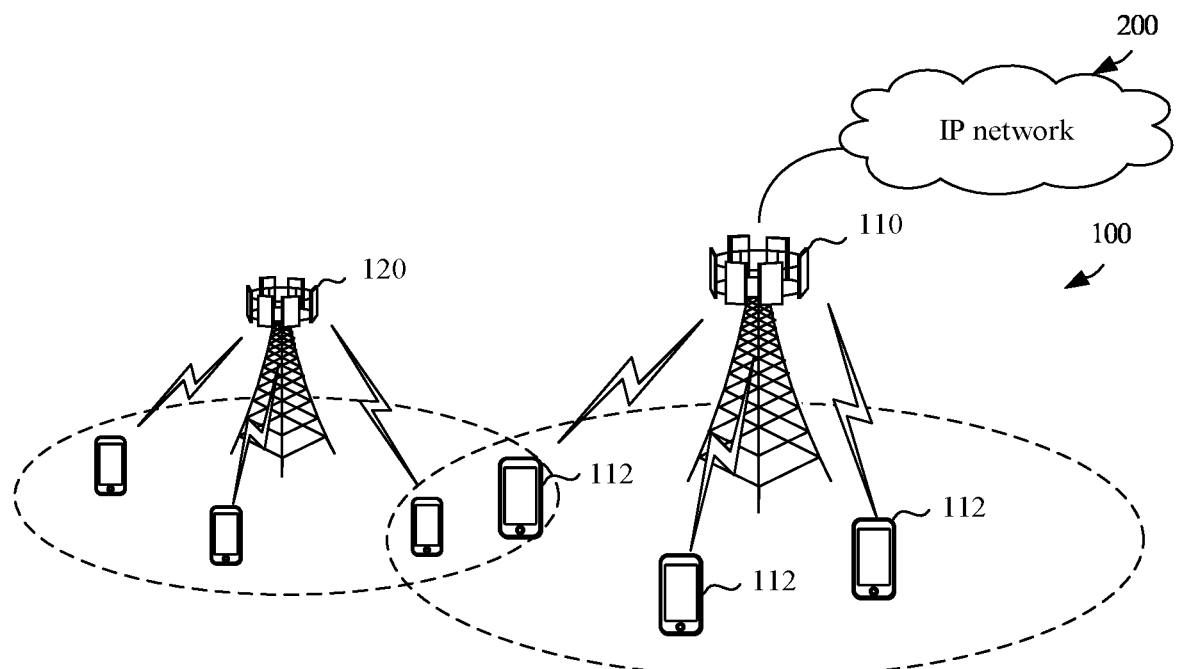
FIG. 1A is a schematic diagram of a wireless communications system according to an embodiment of this application.

The wireless communications system in the embodiments of this application is shown in FIG. 1A. The wireless communications system 100 includes a network device 110 and a terminal 112. When the wireless communications network 100 includes a core network, the network device 110 may be further connected to the core network. The network device 101 may further communicate with an Internet Protocol (IP) network 200 such as the Internet, a private IP network, or another data network. The network device provides a service for a terminal within coverage of the network device. For example, referring to FIG. 1A, the network device 110 provides wireless access for one or more terminals within coverage of the network device 110. In addition, there may be an overlapping area between coverage of network devices, for example, the network device 110 and a network device 120. The network devices may further communicate with each other. For example, the network device 110 may communicate with the network device 120.

Figure 1B:
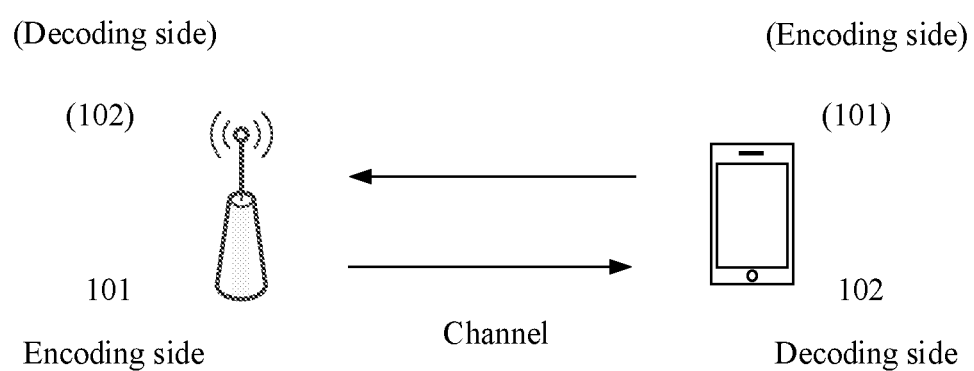
FIG. 1B is a simplified schematic diagram of a wireless communications system according to an embodiment of this application.

When the network device 110 or the terminal 112 sends information or data, a method described in the embodiments of this application may be used. Therefore, for convenience of description, in this embodiment of this application, the communications system 100 is simplified to a system that includes a transmit end 101 and a receive end 102 and that is shown in FIG. 1B. The transmit end 101 may be the network device 110, and the receive end 102 is the terminal 112; or the transmit end 101 is the terminal 112, and the receive end 102 is the network device 110. The network device 110 may be a device configured to communicate with a terminal device. For example, the network device 110 may be an evolved NodeB (eNB or eNodeB) in an LTE system, a network side device in a 5G network, a network side device communicating with a terminal in another network, or a network side device in a future network. Alternatively, the network device may be a relay station, an access point, a vehicle-mounted device, or the like. Alternatively, in a terminal-to-terminal (e.g., D2D) communications system, the network device may be a terminal that functions as a base station. In addition, the network device may include a baseband unit (BBU) and a remote radio unit (RRU). The BBU and the RRU may be placed at different positions. For example, the RRU may be remotely placed in a heavy-traffic area, and the BBU is placed in a central equipment room. The BBU and the RRU may alternatively be placed in a same equipment room. The BBU and the RRU may alternatively be different components on one rack.

The terminal may include a handheld device, a vehicle-mounted device, a wearable device, a computing device that has a wireless communication function, another processing device connected to a wireless modem, a user equipment (UE) in various forms, a mobile station (MS), or the like.

Figure 2:
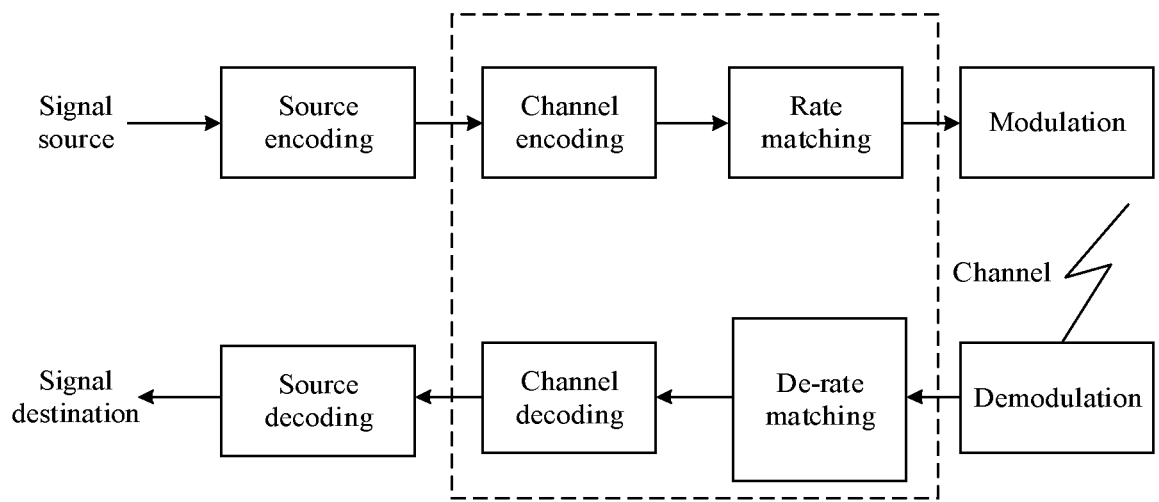
FIG. 2 is a schematic flowchart of a wireless communications system.

FIG. 2 is a schematic flowchart of wireless communication. As shown in FIG. 2, at a transmit end, a signal source is sent after source encoding, channel encoding, rate matching (optional step), and modulation are sequentially performed. At a receive end, the signal source is output to an information destination after demodulation, de-rate matching (optional step), channel decoding, and signal source decoding are sequentially performed. The embodiments of this application relate to channel encoding. A method for encoding a polar code concatenated with a CRC code described in the embodiments of this application may be used for a channel encoding module. The method and the apparatus that are provided in this application are applicable to both a control channel and a data channel.

A polar code (also referred to as a polarization code) is an encoding scheme that may theoretically achieve a Shannon capacity limit and has low encoding and decoding complexity, and may be used for channel encoding. The polar code is a linear block code. When a code length of the polar code tends to be infinite on a binary discrete memoryless channel (BDMC), the polar code can approach a theoretical channel capacity using a successive cancellation (SC) decoding method.

An encoding matrix of the polar code is $G_N$, and an encoding process is $x_1^N = u_1^N G_N$ where $u_1^N = (u_1, u_2, \ldots u_N)$ is a binary row vector whose length is N. $G_N$ is an N×N matrix, and $G_N = F_2^{\otimes(log_2(N))}$. $x_1^N$ is a binary row vector whose length is N, and may also be referred to as an encoded sequence, an output sequence, or a codeword. A codeword or sequence whose length is N and that is obtained through polar encoding is also referred to as a mother code, and N may also be referred to as a mother code length or a code length of the mother code. $F_2^{\otimes(log_2(N))}$ is defined as a Kronecker product of $log_2$ N matrices $F_2$. The matrix is $$F_2 = \begin{bmatrix} 1 & 0 \\ 1 & 1 \end{bmatrix}.$$

Another form of $G_N$ is $G_N = B_N F_2^{\otimes(log_2(N))}$, that is, $F_2^{\otimes(log_2(N))}$ is multiplied by a transposed matrix $B_N$, for example, a bit reversal matrix.

In the encoding process of the polar code, a part of bits in $u_1^N$ are used to carry information, and are referred to as an information bit set or an information bit sequence. A set of indexes of these bits may be referred to as an information bit index set or an information bit position set, and is denoted as A. The other part of bits are set to fixed values pre-agreed on by the receive end and the transmit end, and these bits are referred to as frozen bits or a frozen bit set. A set of indexes corresponding to these frozen bits may be referred to as a frozen bit index set or a frozen bit position set, and is represented using a complementary set $A^c$ of A. The frozen bits are also referred to as fixed bits, and indicate that these positions are used to place fixed bits, and are not used to place information.

The encoding process of the polar code is equivalent to $x_1^N = u_A G_N(A) \oplus u_{A^c} G_N(A^c)$. Herein, GN(A) is a sub-matrix obtained from rows corresponding to the indexes in the set A in GN, and GN(AC) is a sub-matrix obtained from rows corresponding to the indexes in the set $A^c$ in GN. $u_A$ is an information bit set in $u_1^N$, and a quantity of information bits is K. Usually, various types of check bits including but not limited to a cyclic redundancy check (CRC) bit and a parity check (PC) bit are also included in the information bit set. $u_{A^c}$ is a fixed bit set in $u_1^N$ a quantity of fixed bits is (N-K), and the fixed bits are known bits. These fixed bits are generally set to 0. However, the fixed bits may be set randomly provided that the receive end and the transmit end have pre-agreed. Therefore, the encoding process of the polar code may be simplified as $x_1^N = u_A G_N(A)$. Herein, $u_A$ is the information bit set in $u_1^N$, and $u_A$ is a row vector whose length is K, that is, $|A|=K$. $|\cdot|$ indicates a quantity of elements in the set, and K is an information block size. $G_N(A)$ is the sub-matrix obtained from the rows corresponding to the indexes in the set A in the matrix $G_N$, and $G_N(A)$ is a K×N matrix.

Figure 3:
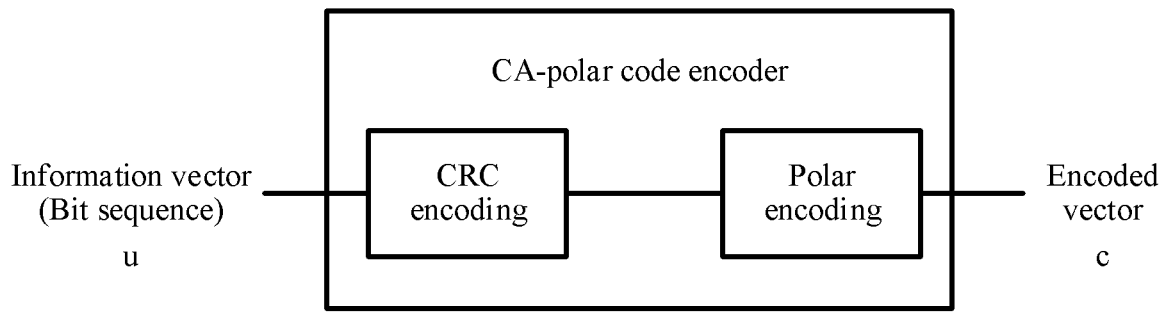
FIG. 3 is a block diagram of a conventional procedure in which a polar code concatenated with a CRC code is encoded.

As a common error detection code, a CRC code is a most common outer code concatenated with the polar code. A block diagram of a conventional procedure in which a polar code concatenated with a CRC code is encoded is shown in FIG. 3. At a transmit end, CRC encoding is performed on all to-be-encoded bit sequences based on a given CRC polynomial. After the CRC encoding, generated CRC check bits are spliced at an end of the original bit sequence. Polar encoding is performed on the CRC check bits obtained after the CRC encoding and the bit sequence. When a CRC codeword length is relatively small, performance in a conventional solution for encoding a polar code concatenated with a CRC code is not optimal due to missing detection. How to enable the polar code to obtain a better performance gain in this case is worth studying.

It may be understood that a bit sequence (or an information vector) in this application document is different from the foregoing information bit set or information bit sequence. The bit sequence in this application document includes a payload bit. When a PC bit exists, information bits also include the PC bit.

Solutions of this application provide a method and an apparatus for encoding a polar code concatenated with a CRC code. In the method, CRC encoding is performed on a part of input bits, and the part of bits are selected according to a specific rule. The rule is considered from three possible perspectives: row weights, reliability, or both row weights and reliability, or another possible perspective. Polar encoding is performed on a CRC code obtained after the CRC encoding and the input bits, such that performance of a polar code obtained after concatenation is improved. A simulation experiment proves that, on an additive white Gaussian noise (AWGN) channel, a polar code concatenated with a CRC code in the solutions of this application has better performance than that in a conventional concatenation solution. In a case of FER=$10^{-2}$ performance is improved by 0.4 decibels (db). In the solutions of this application, a better effect is obtained when a polar code is concatenated with CRC and a length of the CRC is relatively short.

Figure 4A:
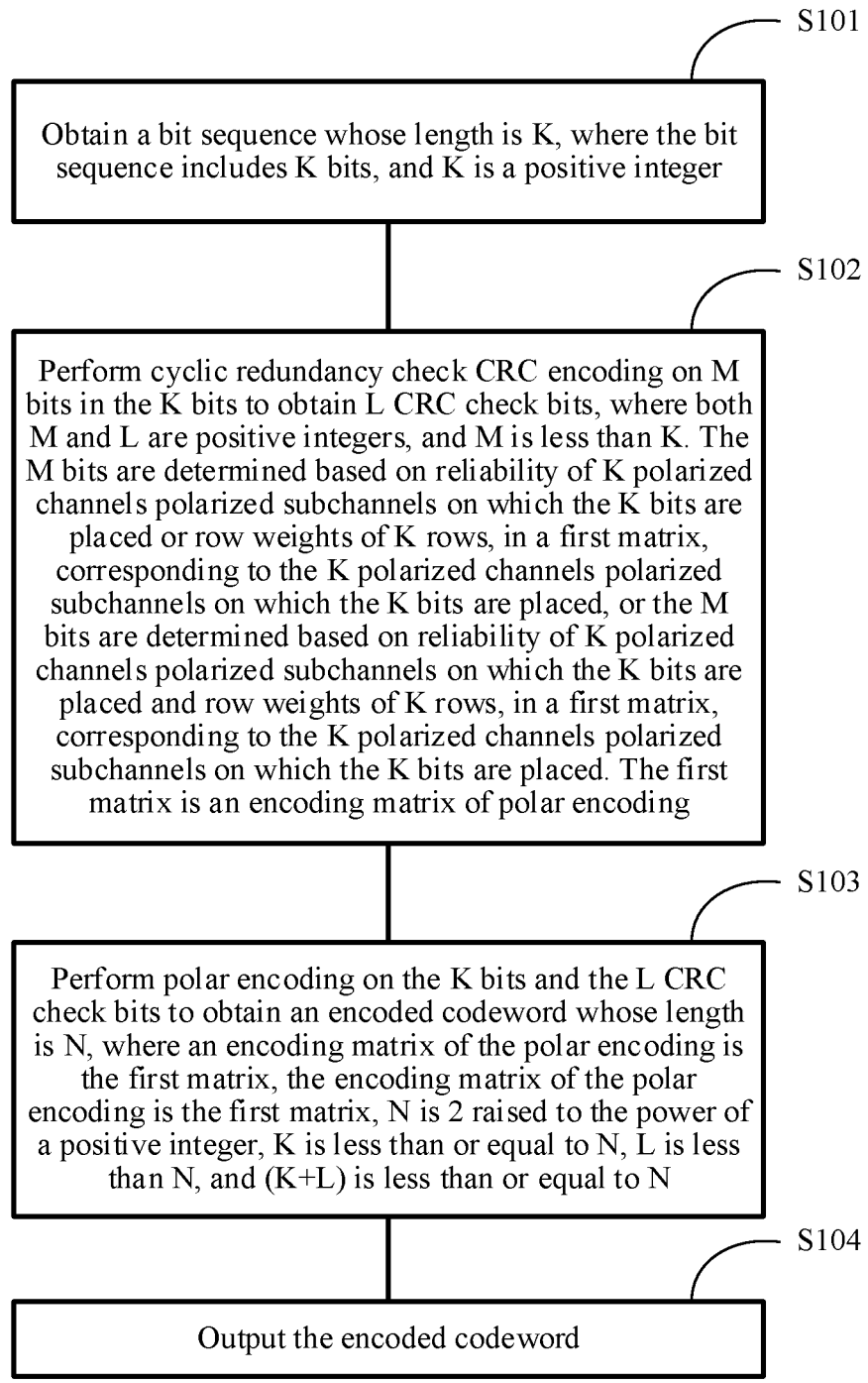
FIG. 4A is a basic flowchart of a method for encoding a polar code concatenated with a CRC code according to an embodiment of this application.

FIG. 4A is a basic flowchart of a method for encoding a polar code concatenated with a CRC code according to an embodiment of this application. In the method, a part of bits are selected from a to-be-encoded bit sequence according to a specific rule to participate in CRC encoding, to generate CRC check bits. Then, the part of bits and the CRC check bits are mapped to polarized subchannels, and remaining bits in the bit sequence are directly mapped to polarized subchannels. Polar encoding is performed on all the bits in the bit sequence and the generated CRC check bits, to generate an encoded codeword. The method is applied to a sending device. As shown in FIG. 4A, the method includes the following steps.

S101: Obtain a bit sequence whose length is K, where the bit sequence includes K bits, and K is a positive integer.

S102: Perform cyclic redundancy check (CRC) encoding on M bits in the K bits to obtain L CRC check bits, where both M and L are positive integers, and M is less than K. The M bits are determined based on reliability of K polarized subchannels on which the K bits are placed or row weights of K rows, in the first matrix, corresponding to the K polarized subchannels on which the K bits are placed, or the M bits are determined based on reliability of K polarized subchannels on which the K bits are placed and row weights of K rows, in the first matrix, corresponding to the K polarized subchannels on which the K bits are placed. The first matrix is an encoding matrix of polar encoding.

S103: Perform polar encoding on the K bits and the L CRC check bits to obtain an encoded codeword whose length is N, where the encoding matrix of the polar encoding is the first matrix, N is 2 raised to the power of a positive integer, K is less than or equal to N, L is less than N, and (K+L) is less than or equal to N.

S104: Output the encoded codeword.

Figure 4B:
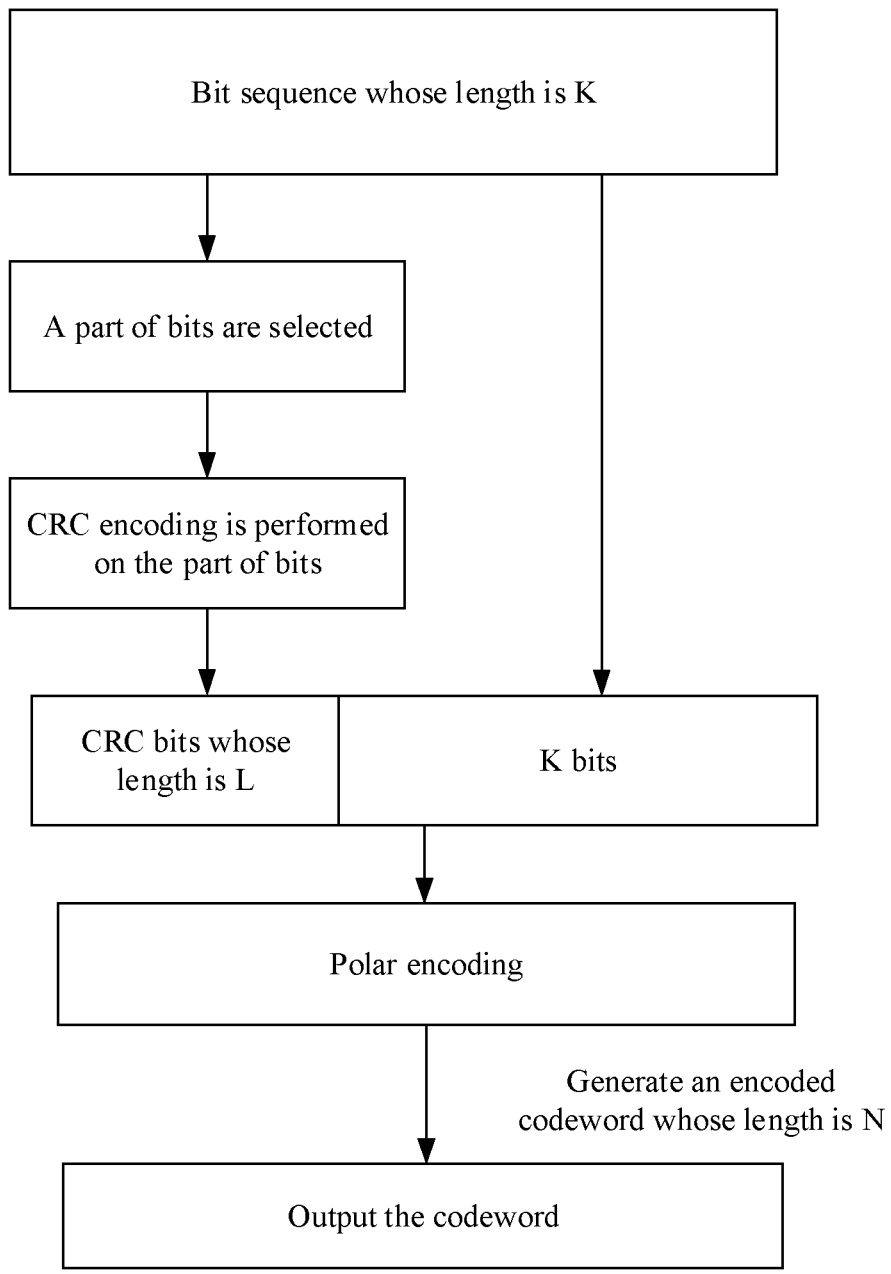
FIG. 4B is a schematic block diagram of a method for encoding a polar code concatenated with a CRC code according to an embodiment of this application.

A schematic diagram of a bit sequence input and output process in the solutions provided in this embodiment of this application is shown in FIG. 4B. In a bit sequence whose length is K, a part of bits (M bits) are selected, and the part of bits are determined based on a row weight or reliability, or determined based on both a row weight and reliability. CRC encoding is performed on the part of bits to obtain CRC check bits whose length is L. Both the L CRC check bits and K bits are used as an input for polar encoding, to generate an encoded codeword whose length is N, where N may also be referred to as a length of a polar code. The codeword obtained after polar encoding is used as an output in an encoding phase.

Optionally, the M bits are determined based on the row weights of the K rows, in the first matrix, corresponding to the K polarized subchannels on which the K bits are placed, and the M bits are bits corresponding to M rows with relatively small row weights in the K rows or in (K+L) rows. The first matrix is the encoding matrix of the polar code.

For example, the first matrix may be an N×N matrix, where N is a code length of the polar code, and N is a positive integer. For example, N may be $2^n$, and n is a non-negative integer.

Optionally, the first matrix may be generated based on a value of N. For example, the first matrix may be generated in an existing manner. For example, the polar code is a linear block code. A generator matrix (which is also referred to as an encoding matrix) of the polar code is $G_N$, and an encoding process of the polar code is $x_1^N = u_1^N G_N$. Herein, $G_N = B_N F^{\otimes n}$ Herein, $$F = \begin{bmatrix} 1 & 0 \\ 1 & 1 \end{bmatrix}.$$

$B_N$ is a transposed matrix, for example, a bit reversal (bit reversal) matrix. Optionally, the bit reversal matrix may alternatively not be used, that is, $G_N = F^{\otimes n}$.

$F^{\otimes n}$ is a Kronecker power of F, and is defined as $F^{\otimes n} = F \otimes F^{\otimes (n-1)}$. Herein, $F^{\otimes n}$ is an N×N matrix.

The matrix $G_N$ or a variant (for example, $F^{\otimes n}$) of the matrix $G_N$ may be used as the first matrix. In a manner, an encoding process of the polar code may be simplified as $x_1^N = u_A G_N(A)$, where $G_N(A)$ is a K×N matrix and is used as the first matrix.

Optionally, in another embodiment, the prestored first matrix corresponding to the value of N may be read. In other words, first matrices corresponding to different values of N may be locally prestored.

Optionally, in another embodiment, the 1×N sequence, for example, the foregoing $u_1^N$, may be generated based on the value of N. The sequence includes an information bit set and a frozen bit set. Alternatively, the prestored 1×N sequence may be read. In other words, sequences $u_1^N$ corresponding to different values of N may be locally prestored.

It may be understood that each element in $u_1^N$ corresponds to N rows of the N×N first matrix, and $u_1^N$ includes the information bit set and the frozen bit set. The bit sequence in S101 may be considered as a subset of the information bit set. The bit sequence in this application document refers to a payload bit. When a PC bit exists, the bit sequence may include the PC bit or may not include the PC bit. Therefore, the K bits in the bit sequence correspond to the K rows in the N×N first matrix, and the M bits in the K bits correspond to the M rows in the N×N first matrix.

For example, in this application document, a "row weight" or a "weight" of each row in a matrix refers to a quantity of non-"0" elements in the row. A manner of determining the weight (the row weight) of each row is adding the non-"0" elements in the row, such that the weight of the row may be equal to a total quantity of elements "1" in the row. Therefore, the K bits correspond to the row weights of the K rows in the N×N first matrix, and the M bits in the K bits correspond to row weights of the M rows in the N×N first matrix.

In an embodiment, the M bits corresponding to the M rows with relatively small row weights in the K rows are selected as bits for CRC encoding.

Optionally, the row weights of the M rows corresponding to the M bits are less than or equal to a first threshold.

Optionally, the first threshold is greater than or equal to a minimum value in the row weights of the K rows corresponding to the K bits.

Optionally, the first threshold is determined based on a minimum code distance of the polar code. When rate matching (puncturing or shortening) is required to enable an encoded code length to meet a target code length, a minimum row weight corresponding to the bits for CRC encoding needs to be determined by calculating a minimum distance of a conventional linear block code. Starting from the minimum row weight, the bits corresponding to the M rows with the relatively small row weights are selected in ascending order of row weights, and a row weight of an $M^{th}$ row may be used as the first threshold.

Optionally, the M bits are determined based on the reliability of the K polarized subchannels on which the K bits are placed.

For example, the M bits are M bits corresponding to M polarized subchannels with relatively low reliability in the K polarized subchannels on which the K bits are placed. CRC encoding is performed on bits with low channel reliability, and bits with high channel reliability are directly mapped to polarized subchannels. Compared with a conventional concatenation solution, this reduces a frame error rate. For a method for determining the reliability of the polarized subchannels, refer to the following embodiment.

Optionally, the M bits are determined based on the reliability of the K polarized subchannels on which the K bits are placed and the row weights of the K rows, in the first matrix, corresponding to the K polarized subchannels on which the K bits are placed, and the step of determining the M bits includes: determining M1 bits corresponding to rows, in the first matrix, whose row weights are less than or equal to a first threshold, where M1 is greater than or equal to M; and determining the M bits from the M1 bits, where the M bits are M bits corresponding to relatively low polarized subchannel reliability in the M1 bits, and M1 is a positive integer.

In an embodiment, the bits for CRC encoding are selected by comprehensively considering the row weights of the first matrix and the reliability of the polarized subchannels. First, the K row weights are sorted in ascending order, and bits corresponding to relatively small M1 row weights are selected based on a specified threshold, where M1 is greater than or equal to a quantity M of bits for CRC encoding. Then, from a perspective of the reliability of the polarized subchannels, reliability of polarized subchannels corresponding to the M1 bits is sorted, and bits corresponding to the M polarized subchannels with the relatively low reliability are selected as input bits of a CRC encoder.

Optionally, the M bits are determined based on the reliability of the K polarized subchannels on which the K bits are placed and the row weights of the K rows, in the first matrix, corresponding to the K polarized subchannels on which the K bits are placed, and the step of determining the M bits includes: determining M2 bits from the K bits, where the M2 bits are M2 bits corresponding to relatively low polarized subchannel reliability in the K bits, and M2 is greater than or equal to M; and determining the M bits from the M2 bits, where row weights of M rows corresponding to the M bits are less than or equal to a second threshold, and M2 is a positive integer.

In another embodiment, the bits for CRC encoding are selected by comprehensively considering the row weights of the first matrix and the reliability of the polarized subchannels. First, from a perspective of the reliability of the polarized subchannels, reliability of polarized subchannels corresponding to the K bits is sorted, and bits corresponding to M2 polarized subchannels with relatively low reliability are selected, where M2 is greater than or equal to a quantity M of bits for CRC encoding. Then, M2 row weights are sorted in ascending order, and bits corresponding to relatively small M row weights are selected as input bits of a CRC encoder based on a specified threshold.

In this embodiment of this application, both a reliability factor and a row weight factor are considered. However, a sequence of using the two factors is not limited in this embodiment of this application.

Figure 5:
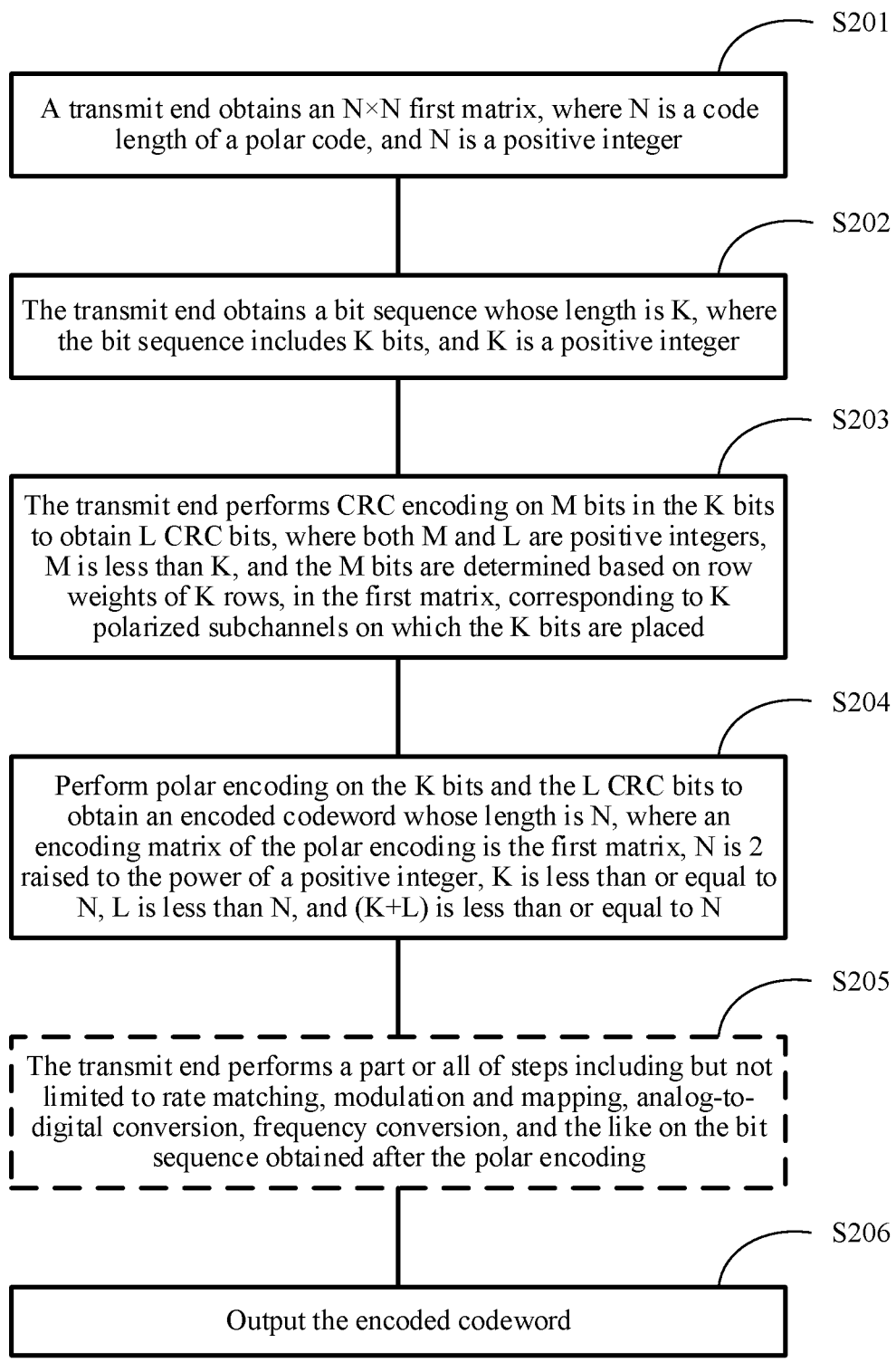
FIG. 5 is a flowchart of a polar code-based CRC code generation method according to an embodiment of this application.

FIG. 5 is a flowchart of a polar code-based CRC code generation method according to an embodiment of this application. The method is applied to a sending device (which is also referred to as a transmit end). In the method, bits for CRC encoding in a bit sequence are selected from a perspective of row weights of an encoding matrix, and the method includes the following steps.

S201: The transmit end obtains an N×N first matrix, where N is a code length of a polar code, and N is a positive integer.

In an embodiment, N is 32, the first matrix $G_{32}$ is a 32×32 matrix, and the matrix is generated from a Kronecker power: $G_{32} = F^{\otimes 5}$. Herein, $$F = \begin{bmatrix} 1 & 0 \\ 1 & 1 \end{bmatrix}.$$

The first matrix $G_{32}$ is shown as follows:

$$G_{32} = \begin{bmatrix}
1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 0 & 0 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 1 & 0 & 1 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 1 & 1 & 1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 0 & 0 & 0 & 0 & 0 & 0 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 1 & 0 & 0 & 0 & 0 & 0 & 1 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 1 & 1 & 0 & 0 & 0 & 0 & 1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 1 & 0 & 0 & 0 & 1 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 \\
1 & 1 & 0 & 0 & 1 & 1 & 0 & 0 & 1 & 1 & 0 & 0 & 1 & 1 & 0 & 0 & 0 & 0 & 0 & 0 & 0 & 0 & 0 & 0 & 0 & 0 & 0 & 0 & 0 & 0 & 0 & 0 \\
1 & 0 & 1 & 0 & 1 & 0 & 1 & 0 & 1 & 0 & 1 & 0 & 1 & 0 & 1 & 0 & 0 & 0 & 0 & 0 & 0 & 0 & 0 & 0 & 0 & 0 & 0 & 0 & 0 & 0 & 0 & 0 \\
1 & 1 & 1 & 1 & 1 & 1 & 1 & 1 & 1 & 1 & 1 & 1 & 1 & 1 & 1 & 1 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 \\
1 & 1 & 0 & 0 & 0 & 0 & 0 & 0 & 0 & 0 & 0 & 0 & 0 & 0 & 0 & 0 & 1 & 1 & 0 & 0 & 0 & 0 & 0 & 0 & 0 & 0 & 0 & 0 & 0 & 0 & 0 & 0 \\
1 & 0 & 1 & 0 & 0 & 0 & 0 & 0 & 0 & 0 & 0 & 0 & 0 & 0 & 0 & 0 & 1 & 0 & 1 & 0 & 0 & 0 & 0 & 0 & 0 & 0 & 0 & 0 & 0 & 0 & 0 & 0 \\
1 & 1 & 1 & 1 & 0 & 0 & 0 & 0 & 0 & 0 & 0 & 0 & 0 & 0 & 0 & 0 & 1 & 1 & 1 & 1 & 0 & 0 & 0 & 0 & 0 & 0 & 0 & 0 & 0 & 0 & 0 & 0 \\
1 & 0 & 0 & 0 & 1 & 0 & 0 & 0 & 0 & 0 & 0 & 0 & 0 & 0 & 0 & 0 & 1 & 0 & 0 & 0 & 1 & 0 & 0 & 0 & 0 & 0 & 0 & 0 & 0 & 0 & 0 & 0 \\
1 & 1 & 0 & 0 & 1 & 1 & 0 & 0 & 0 & 0 & 0 & 0 & 0 & 0 & 0 & 0 & 1 & 1 & 0 & 0 & 1 & 1 & 0 & 0 & 0 & 0 & 0 & 0 & 0 & 0 & 0 & 0 \\
1 & 0 & 1 & 0 & 1 & 0 & 1 & 0 & 0 & 0 & 0 & 0 & 0 & 0 & 0 & 0 & 1 & 0 & 1 & 0 & 1 & 0 & 1 & 0 & 0 & 0 & 0 & 0 & 0 & 0 & 0 & 0 \\
1 & 1 & 1 & 1 & 1 & 1 & 1 & 1 & 0 & 0 & 0 & 0 & 0 & 0 & 0 & 0 & 1 & 1 & 1 & 1 & 1 & 1 & 1 & 1 & 0 & 0 & 0 & 0 & 0 & 0 & 0 & 0 \\
1 & 0 & 0 & 0 & 0 & 0 & 0 & 0 & 1 & 0 & 0 & 0 & 0 & 0 & 0 & 0 & 1 & 0 & 0 & 0 & 0 & 0 & 0 & 0 & 1 & 0 & 0 & 0 & 0 & 0 & 0 & 0 \\
1 & 1 & 0 & 0 & 0 & 0 & 0 & 0 & 1 & 1 & 0 & 0 & 0 & 0 & 0 & 0 & 1 & 1 & 0 & 0 & 0 & 0 & 0 & 0 & 1 & 1 & 0 & 0 & 0 & 0 & 0 & 0 \\
1 & 0 & 1 & 0 & 0 & 0 & 0 & 0 & 1 & 0 & 1 & 0 & 0 & 0 & 0 & 0 & 1 & 0 & 1 & 0 & 0 & 0 & 0 & 0 & 1 & 0 & 1 & 0 & 0 & 0 & 0 & 0 \\
1 & 1 & 1 & 1 & 0 & 0 & 0 & 0 & 1 & 1 & 1 & 1 & 0 & 0 & 0 & 0 & 1 & 1 & 1 & 1 & 0 & 0 & 0 & 0 & 1 & 1 & 1 & 1 & 0 & 0 & 0 & 0 \\
1 & 0 & 0 & 0 & 1 & 0 & 0 & 0 & 1 & 0 & 0 & 0 & 1 & 0 & 0 & 0 & 1 & 0 & 0 & 0 & 1 & 0 & 0 & 0 & 1 & 0 & 0 & 0 & 1 & 0 & 0 & 0 \\
1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 \\
1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 \\
1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1
\end{bmatrix}$$

S202: The transmit end obtains a bit sequence whose length is K, where the bit sequence includes K bits, and K is a positive integer.

In the foregoing embodiment, K=12.

S203: The transmit end performs CRC encoding on M bits in the K bits to obtain L CRC check bits, where both M and L are positive integers, M is less than K, and the M bits are determined based on row weights of K rows, in the first matrix, corresponding to the K polarized subchannels on which the K bits are placed.

Optionally, indexes i of the K bits correspond to the K rows of the first matrix (which may be a generator matrix of the polar code). A is denoted as a set of the indexes i of the bits, w is denoted as a weight of each row (that is, the row weight refers to a quantity of elements "1" in the row), and weights of rows, in the first matrix, corresponding to the indexes of the bits are denoted as $W_i$. When no puncturing is performed, a minimum value in the weights of the rows, in the first matrix, corresponding to the indexes i of the bits may be denoted as a minimum distance (dmin), that is, $$d\min = \min_{i \in A} w_i.$$

Some bits corresponding to rows, in the first matrix, whose row weights are dmin may be selected to perform CRC encoding, and are used as input bits of a CRC encoder.

M bits are selected from the some bits corresponding to the rows, in the first matrix, whose row weights are dmin, to perform CRC encoding, and are used as input bits of a CRC encoder; some bits corresponding to rows, in the first matrix, whose row weights are dmin and 2*dmin are selected to perform CRC encoding, and are used as input bits of a CRC encoder, where z is a positive integer; some bits corresponding to rows, in the first matrix, whose row weights are dmin, 2*dmin, . . . , and z*dmin are selected to perform CRC encoding, and are used as input bits of a CRC encoder, where z is a positive integer; or a row weight of each row in the first matrix is in a basic unit of dmin, a row weight of an $i^{th}$ row is represented as $\delta i$*dmin, and some bits corresponding to rows, in the first matrix, whose row weights $\delta i$ are less than a specific threshold are selected to perform CRC encoding, and are used as input bits of a CRC encoder, where $\delta$ is a positive number.

It may be understood that, in this application document, a "row weight" or a "weight" of each row in a matrix refers to a quantity of non-"0" elements in the row. A manner of determining the weight (the row weight) of each row is adding non-"0" elements in the row, such that the weight of the row may represent a total quantity of elements "1" in the row. For example, a weight of a row, in a generator matrix, corresponding to an information bit is a weight of a row, in the generator matrix, corresponding to an index i of the information bit.

Optionally, the minimum distance may be defined in a plurality of manners based on different conditions. When a code length needs to be adjusted through puncturing, a manner of determining the minimum distance is that the minimum distance is obtained using a conventional algorithm, for example, an Anne Canteaut algorithm, for calculating a minimum distance of a linear block code.

Optionally, an interleaving operation may be performed on the L CRC check bits.

In the foregoing embodiment, rows of the matrix sequentially correspond to an input vector $u_1^{32}$ of polar encoding in top-to-bottom order, $u_1^{32}$ includes an information bit set and a frozen bit set, and each element of $u_1^{32}$ corresponds to one polarized subchannel. [1] is denoted as the first row of the first matrix $G_{32}$ and corresponds to the first polarized subchannel. [2] is denoted as the second row of the first matrix $G_{32}$ and corresponds to the second polarized subchannel, . . . , and [32] is denoted as the thirty-second row of the first matrix $G_{32}$ and corresponds to the thirty-second polarized subchannel. The information bit set is placed on polarized subchannels corresponding to [32 31 30 28 24 16 29 23 26 27 22 15 14 20 12 8]. For example, it is specified that a CRC check code is placed on polarized subchannels corresponding to [32 31 30 28], and the bit sequence is placed on polarized subchannels corresponding to [24 16 29 23 26 27 22 15 14 20 12 8]. It can be learned based on a quantity of elements "1" in each row that [24 16 29 23 26 27 22 15 14 20 12 8] are respectively 8, 8, 8, 8, 8, 8, 8, 8, 8, 8, 16, and 16, there are two rows whose row weights are 16, there are 10 rows whose row weights are 8, and row weights corresponding to [32 31 30 28] are respectively 16, 16, 16, and 32. Four bits may be selected from some information bits corresponding to the rows whose row weights are 8, to perform CRC encoding, and are used as input bits of the CRC encoder.

S204: Perform polar encoding on the K bits and the L CRC check bits to obtain an encoded codeword whose length is N, where an encoding matrix of the polar encoding is the first matrix, N is 2 raised to the power of a positive integer, K is less than or equal to N, L is less than N, and (K+L) is less than or equal to N.

S205 (optional step): The transmit end performs a part or all of steps including but not limited to rate matching, modulation and mapping, analog-to-digital conversion, frequency conversion, and the like on the bit sequence obtained after the polar encoding.

It should be noted that a rate matching step in step S105 is optional. Because a code length of a codeword (mother code) obtained after the polar encoding is 2 raised to the power of an integer, a polar code with any code length needs to be implemented through rate matching in an actual application. Certainly, if the code length of the code block obtained after the polar encoding is the same as a code length of a target code, rate matching does not need to be performed. Because this embodiment of the present disclosure does not focus on step S105, details are not described herein.

S206: Output the encoded codeword.

Figure 6:
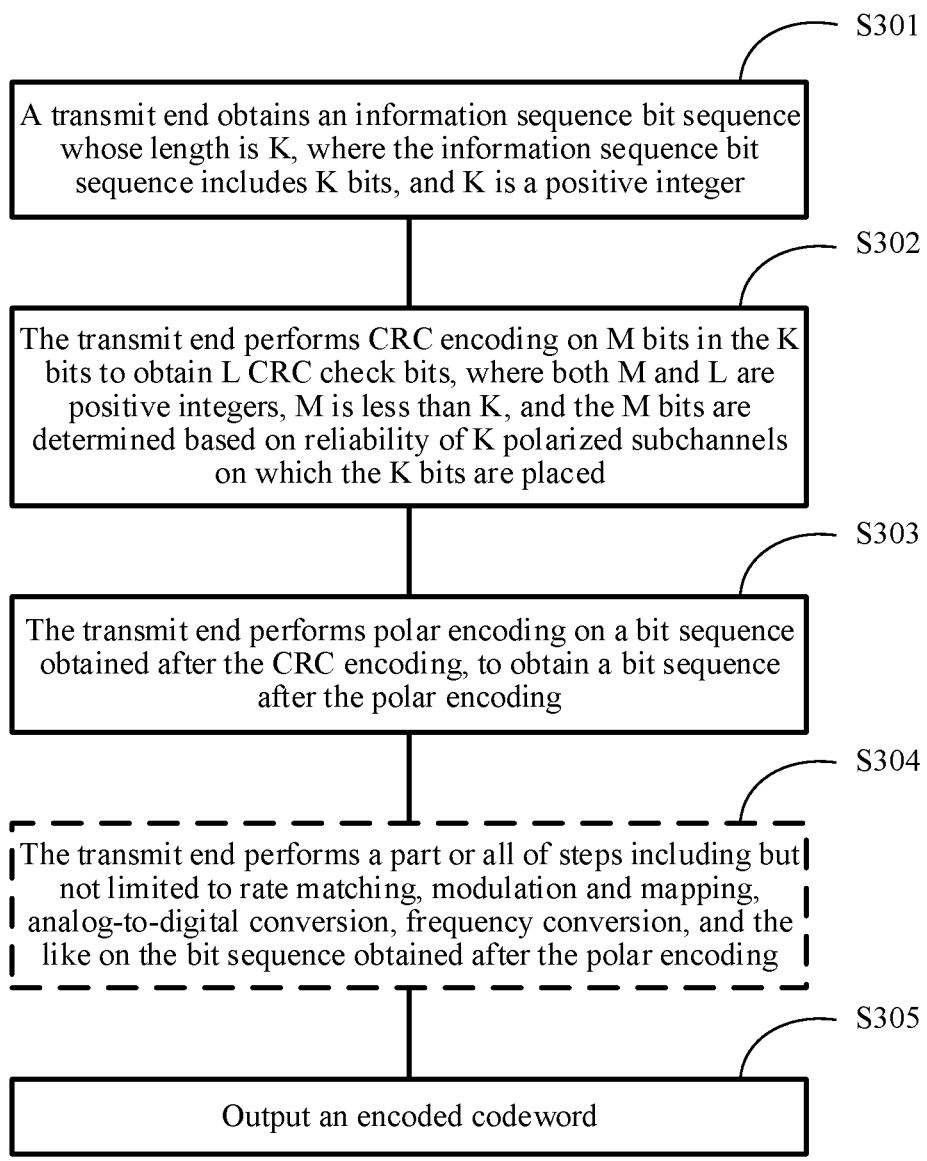
FIG. 6 is a flowchart of another polar code-based CRC code generation method according to an embodiment of this application.

FIG. 6 is a flowchart of another polar code-based CRC code generation method according to an embodiment of this application. The method is applied to a sending device. The method includes the following steps.

S301: A transmit end obtains a bit sequence whose length is K, where the bit sequence includes K bits, and K is a positive integer.

S302: The transmit end performs CRC encoding on M bits in the K bits to obtain L CRC check bits, where both M and L are positive integers, M is less than K, and the M bits are determined based on reliability of K polarized subchannels on which the K bits are placed.

Optionally, the M bits corresponding to the M polarized subchannels with relatively low reliability are determined according to a table or a sequence that represents reliability, or a reliability order of M1 polarized subchannels of the M1 bits is determined according to a table or a sequence that represents reliability.

The reliability of the K polarized subchannels may be sorted according to a pre-specified table or sequence that represents reliability, to obtain reliability statuses of all the K polarized subchannels. For example, a reliability order of the K polarized subchannels may be determined according to Table 5.3.1.2-1: polar sequence $Q_0^{N_{max}-1}$ and reliability $W(Q_i^{N_{max}})$ corresponding to the polar sequence in the technical specification (TS) 38.212 released by the 3rd Generation Partnership Project (3GPP). t bits corresponding to t polarized subchannels with relatively low reliability in the K polarized subchannels are selected as the M bits in step S302 based on the reliability order, where t is a positive integer, and t=M.

Optionally, the M bits corresponding to the M polarized subchannels with relatively low reliability are determined based on a capacity (I(W)), or a reliability order of M1 polarized subchannels of the M1 bits is determined based on a capacity (I(W)).

For example, the reliability order may be determined by determining a capacity (I(W)) of each subchannel in the K polarized subchannels, a subchannel with a large capacity has high reliability, and a subchannel with a small capacity has low reliability. t bits corresponding to t polarized subchannels with relatively low reliability in the K polarized subchannels are selected as the M bits in step S302 based on the reliability order, where t is a positive integer, and t=M. The capacity of each channel may be calculated in an existing manner. For example, given a binary discrete memoryless channel W, the capacity I(W) is defined as follows:

$$I(W) \triangleq \sum_{y \in y} \sum_{x \in X} \frac{1}{2} W(y|x) \log \frac{W(y|x)}{\frac{1}{2} W(y|0) + \frac{1}{2} W(y|1)}. \quad (1)$$

Optionally, the M bits corresponding to the M polarized subchannels with relatively low reliability are determined based on a Bhattacharyya parameter (Z(W)), or a reliability order of M1 polarized subchannels of the M1 bits is determined based on a Bhattacharyya parameter (Z(W)).

For example, the Bhattacharyya parameter is related to an upper bound of a maximum likelihood decoding frame error rate. Therefore, the reliability order may be further determined by determining a Bhattacharyya parameter (Z(W)) of each subchannel in the K polarized subchannels, a polarized subchannel with a small value of the Bhattacharyya parameter has high reliability, and a polarized subchannel with a large value of the Bhattacharyya parameter has low reliability. t bits corresponding to t polarized subchannels with relatively low reliability in the K polarized subchannels are selected as the M bits in step S302 based on the reliability order, where t is a positive integer, and t=M. Given a binary discrete memoryless channel W, the Bhattacharyya parameter Z(W) is defined as follows:

$$Z(W) \triangleq \sum_{y \in y} \sqrt{W(y|0)W(y|1)}. \quad (2)$$

Optionally, the M bits corresponding to the M polarized subchannels with relatively low reliability are determined based on an error probability (P(W)), or a reliability order of M1 polarized subchannels of the M1 bits is determined based on an error probability (P(W)).

For example, the reliability order may be further determined by determining an error probability (P(W)) of each subchannel in the K polarized subchannels, a polarized subchannel with a small error probability has high reliability, and a polarized subchannel with a large error probability has low reliability. For example, an error pattern of each channel may be obtained through Monte Carlo simulation, and the error probability of each channel may be determined with reference to a quantity of times of the simulation. t bits corresponding to t polarized subchannels with relatively low reliability in the K polarized subchannels are selected as the M bits in step S302 based on the reliability order, where t is a positive integer, and t=M.

Optionally, the reliability order of the K bits may be further determined using a function relationship f(I(W), Z(W), P(W), C), where I(W) represents a bit capacity, Z(W) represents a Bhattacharyya parameter, P(W) represents an error probability, and C represents an adjustment parameter (which is determined based on parameters such as a code length and a bit rate). A function value of f(I(W), Z(W), P(W), C) is calculated, a larger function value indicates higher reliability, and a smaller function value indicates higher reliability. It may be understood that a new function is constructed by performing an operation such as taking the reciprocal of f(I(W), Z(W), P(W), C), a smaller new function value indicates higher reliability, and a larger new function value indicates lower reliability.

t bits corresponding to t polarized subchannels with relatively low reliability in the K information bits are selected as the M bits in step S302 based on the reliability order, where t is a positive integer, and t=M.

A form of reliability measurement is not limited in this embodiment of this application, and t information bits with low reliability may be selected with reference to parameters for the reliability measurement, for example, parameters such as the bit capacity, the Bhattacharyya parameter, and the error probability, and a combination thereof. That reliability of information bits is determined in a manner of constructing a function relationship between the reliability and the parameters such as the bit capacity, the Bhattacharyya parameter, and the error probability also falls within the scope of this embodiment of this application.

S303: The transmit end performs polar encoding on a bit sequence obtained after the CRC encoding, to obtain a bit sequence after the polar encoding.

S304 (optional step): The transmit end performs a part or all of steps including but not limited to rate matching, modulation and mapping, analog-to-digital conversion, frequency conversion, and the like on the bit sequence obtained after the polar encoding.

S305: The transmit end outputs a codeword obtained after the polar encoding.

The optional step has been discussed in the foregoing embodiment, and details are not described herein again.

Figure 7:
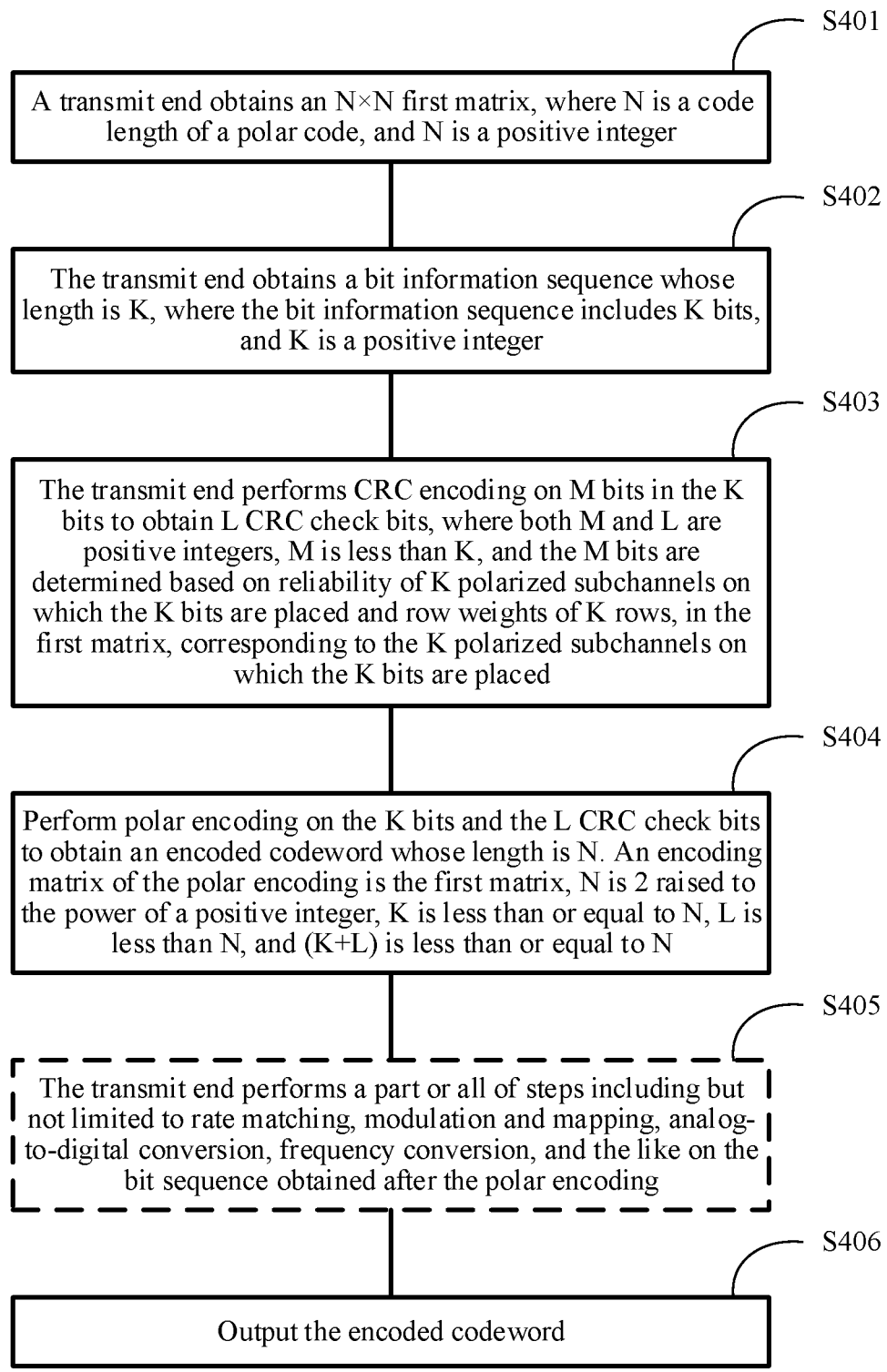
FIG. 7 is a flowchart of another polar code-based CRC code generation method according to an embodiment of this application.

FIG. 7 is a flowchart of another polar code-based CRC code generation method according to an embodiment of this application. The method is applied to a sending device. The method includes the following steps.

S401: A transmit end obtains an N×N first matrix, where N is a code length of a polar code, and N is a positive integer.

The transmit end obtains a bit sequence whose length is K, where the bit sequence includes K bits, and K is a positive integer.

S402: The transmit end obtains a bit sequence whose length is K, where the bit sequence includes K bits, and K is a positive integer.

S403: The transmit end performs CRC encoding on M bits in the K bits to obtain L CRC check bits, where both M and L are positive integers, M is less than K, and the M bits are determined based on reliability of K polarized subchannels on which the K bits are placed and row weights of K rows, in the first matrix, corresponding to the K polarized subchannels on which the K bits are placed.

Optionally, M1 bits in the M bits are determined based on bits corresponding to rows, in the N×N first matrix, whose row weights are a third set. The third set is dmin, 2dmin, . . . , and zdmin. Alternatively, the third set is dmin. Alternatively, the third set is δi*dmin. δi is less than a specific threshold, and i belongs to (1, 2, . . . , 32) and corresponds to an $i^{th}$ row of the first matrix, where z is a positive integer, and δi is a positive number. dmin refers to a minimum value in the row weights corresponding to the K bits in the N×N first matrix. Remaining (M−M1) bits in the M bits are determined using (M−M1) subchannels with relatively low reliability in the K polarized subchannels. First, polarized subchannels corresponding to the M1 bits in the M bits are excluded from a reliability order, and then the (M−M1) subchannels with the relatively low reliability are selected from the order. (M−M1) bits corresponding to the (M−M1) subchannels with the relatively low reliability are the remaining (M−M1) bits in the M bits, where M1 is less than M.

In an embodiment, the M1 bits are determined as to-be-encoded bits for CRC encoding using row weights. For example, the M1 bits corresponding to rows, in the first matrix, whose row weights are dmin, 2*dmin, . . . , and z*dmin are selected. It may be understood that the foregoing row weight set is merely an example, and does not constitute a limitation on the embodiment. Remaining (M−M1) bits in the M bits are determined using reliability of polarized subchannels. First, polarized subchannels corresponding to the M1 bits in the M bits are excluded from a reliability order, and then (M−M1) subchannels with relatively low reliability are selected from the order in ascending order of reliability. (M−M1) bits corresponding to the (M−M1) subchannels with the relatively low reliability are the remaining (M−M1) bits in the M bits, where M1 is less than M. First, an objective of excluding the polarized subchannels corresponding to the M1 bits is that if the (M−M1) subchannels are directly selected from the reliability order, an intersection may exist between the polarized subchannels corresponding to the M1 bits and the (M−M1) channels. In this way, a quantity of finally selected bits is less than M.

It may be understood that the polarized subchannels corresponding to the M1 bits may alternatively be determined based on row weights. In this case, M1 is greater than M. M polarized subchannels with relatively low reliability continue to be selected in ascending order of reliability based on the M1 polarized subchannels until a quantity of selected polarized subchannels reaches M. In this case, bits corresponding to the M polarized subchannels are the M bits in step S403.

A method for determining dmin is the same as the method in the foregoing embodiment, and a method for determining the reliability order is also the same as the method in the foregoing embodiment. Details are not described again.

S404: Perform polar encoding on the K bits and the L CRC check bits to obtain an encoded codeword whose length is N, where an encoding matrix of the polar encoding is the first matrix, N is 2 raised to the power of a positive integer, K is less than or equal to N, L is less than N, and (K+L) is less than or equal to N.

This step may include interleaving, that is, making the foregoing CRC bits become DCRC bits.

S405 (optional step): The transmit end performs a part or all of steps including but not limited to rate matching, modulation and mapping, analog-to-digital conversion, frequency conversion, and the like on the code block obtained after the polar encoding.

S406: Output the encoded codeword.

The optional step has been described in the foregoing embodiment, and details are not described herein again.

Figure 8:
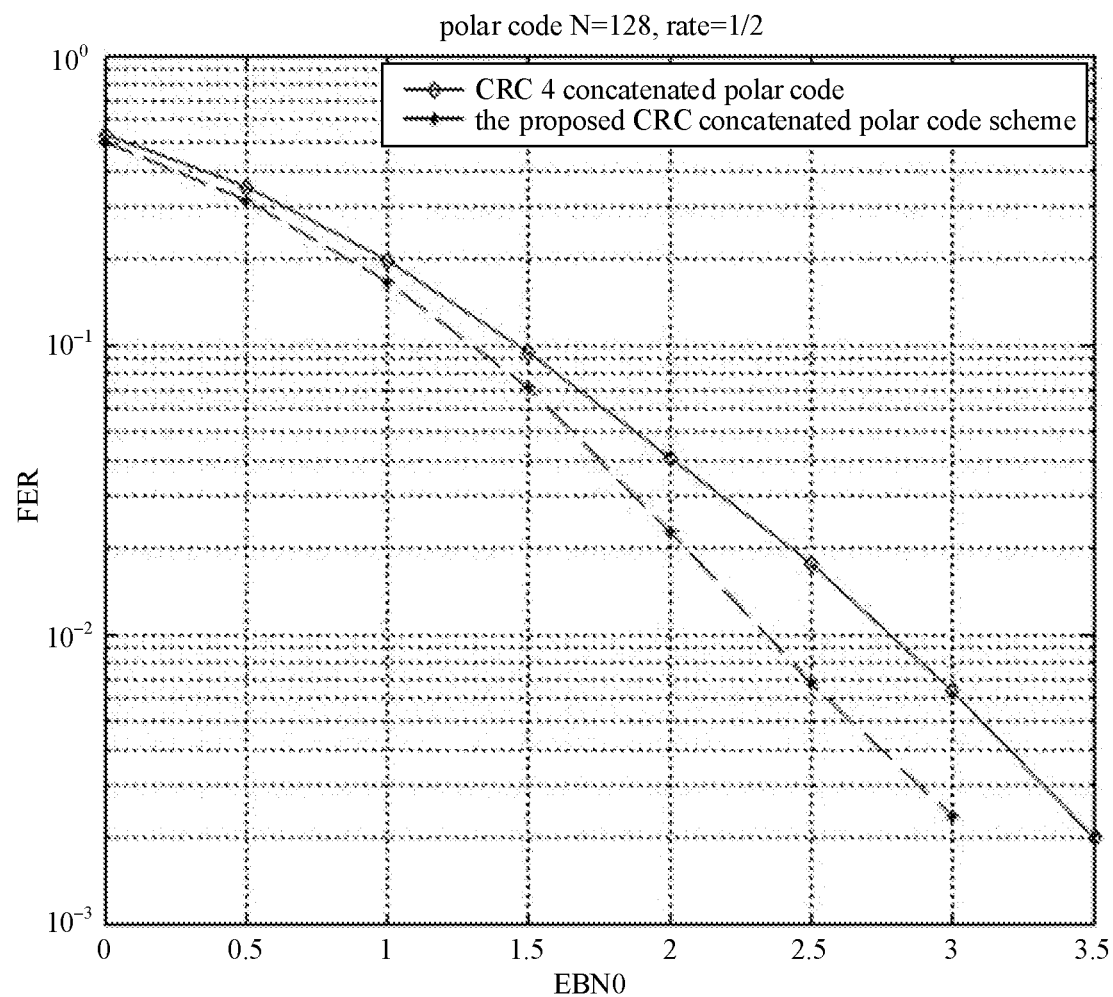
FIG. 8 shows simulation comparison curves of frame error rates (FERs) of a solution of this application and a conventional concatenation solution under a specific condition.

FIG. 8 shows simulation comparison curves of frame error rates (FERs) of a solution of this application and a conventional concatenation solution under a specific condition (on an AWGN channel, a bit rate R of a polar code is 1/2, a mother code length N is 128, and a CRC code length is 4). In the figure, a solid line whose data point is a rhombus is an FER curve of a conventional polar code concatenated with four CRC check bits, and a dashed line whose data point is an asterisk is an FER curve of a polar code in which the concatenation solution in this application is used. In this solution, information bits for CRC encoding are determined based on row weights of an encoding matrix, S is 2, and other conditions remain unchanged. It is verified through a simulation experiment that, on an AWGN channel, compared with a conventional solution for polar code concatenated with a CRC code, overall performance is better in the solution in this application, and a frame error rate is significantly reduced. In a case of FER=$10^{-2}$, performance is improved by 0.4 db. Using similar simulation experiments, in a solution in which reliability of polarized subchannels is considered (on an AWGN channel, a bit rate R of a polar code is 1/2, a mother code length N is 128, a CRC code length is 4, and a quantity t of bits placed on polarized subchannels with relatively low reliability is 48) and a solution in which row weights of an encoding matrix and channel reliability are comprehensively considered (on an AWGN channel, a bit rate R of a polar code is 1/2, a mother code length N is 128, a CRC code length is 4, a quantity t of bits placed on polarized subchannels with relatively low reliability is 48, and S is 2), good performance results are obtained.

In this application, better performance can be obtained in a case of a relatively small CRC length. For example, the polar encoding method provided in the embodiments of this application may be used when a CRC length is less than or equal to a preset threshold.

Figure 9:
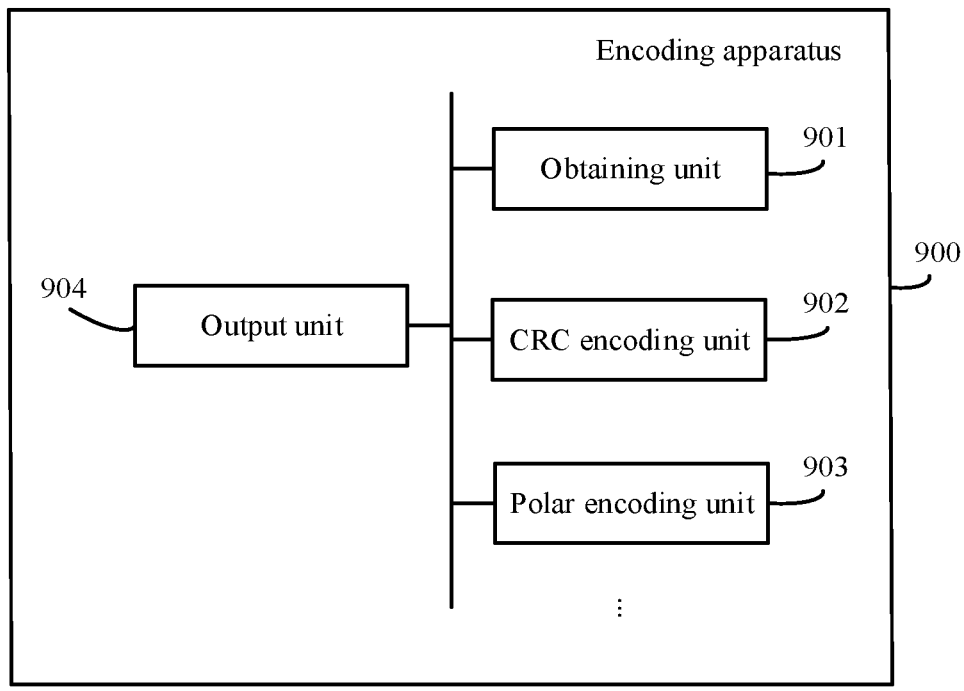
FIG. 9 is a schematic structural diagram of an encoding apparatus 900 according to this application.

FIG. 9 is a schematic structural diagram of an encoding apparatus 900 according to this application. The encoding apparatus 900 includes: an obtaining unit 901 configured to obtain a bit sequence whose length is K, where the bit sequence includes K bits, and K is a positive integer; a CRC encoding unit 902 configured to perform CRC encoding on M bits in the K bits to obtain L CRC check bits, where both M and L are positive integers, and M is less than K; a polar encoding unit 903 configured to perform polar encoding on the K bits and the L CRC check bits to obtain an encoded codeword whose length is N, where an encoding matrix of the polar encoding is a first matrix, and the M bits are determined based on reliability of K polarized subchannels on which the K bits are placed or row weights of K rows, in the first matrix, corresponding to the K polarized subchannels on which the K bits are placed, or the M bits are determined based on reliability of K polarized subchannels on which the K bits are placed and row weights of K rows, in the first matrix, corresponding to the K polarized subchannels on which the K bits are placed, where N is 2 raised to the power of a positive integer, K is less than or equal to N, L is less than N, and (K+L) is less than or equal to N; and an output unit 904 configured to output the encoded codeword.

Optionally, the M bits are determined based on the row weights of the K rows, in the first matrix, corresponding to the K polarized subchannels on which the K bits are placed, and the M bits are bits corresponding to M rows with relatively small row weights in the K rows or in (K+L) rows. The first matrix is an encoding matrix of a polar code. Usually, for the polar code, a small row weight of the encoding matrix indicates low reliability of a polarized subchannel, and it is very convenient to determine the reliability of the polarized subchannel using the row weight of the encoding matrix.

Optionally, the row weights of the M rows corresponding to the M bits are less than or equal to a first threshold.

Optionally, the first threshold is greater than or equal to a minimum value in the row weights of the K rows corresponding to the K bits.

Optionally, the first threshold is determined based on a minimum code distance of the polar code.

Optionally, the M bits are determined based on the reliability of the K polarized subchannels on which the K bits are placed, and more specifically, the M bits are M bits corresponding to M polarized subchannels with relatively low reliability in the K polarized subchannels on which the K bits are placed. CRC encoding is performed on bits with low channel reliability, and bits with high channel reliability are directly mapped to polarized subchannels, thereby reducing a frame error rate.

Optionally, the M bits are determined based on the reliability of the K polarized subchannels on which the K bits are placed and the row weights of the K rows, in the first matrix, corresponding to the K polarized subchannels on which the K bits are placed, and the step of determining the M bits includes: determining M1 bits corresponding to rows, in the first matrix, whose row weights are less than or equal to a first threshold, where M1 is greater than or equal to M; and determining the M bits from the M1 bits, where the M bits are M bits corresponding to relatively low polarized subchannel reliability in the M1 bits, and M1 is a positive integer.

Optionally, the M bits are determined based on the reliability of the K polarized subchannels on which the K bits are placed and the row weights of the K rows, in the first matrix, corresponding to the K polarized subchannels on which the K bits are placed, and the step of determining the M bits includes: determining M2 bits from the K bits, where the M2 bits are M2 bits corresponding to relatively low polarized subchannel reliability in the K bits, M2 is greater than or equal to M, and M2 is a positive integer; and determining the M bits from the M2 bits, where row weights of M rows corresponding to the M bits are less than or equal to a second threshold.

Optionally, the M bits corresponding to the M polarized subchannels with the relatively low reliability are determined according to a table or a sequence that represents reliability, or a reliability order of M1 polarized subchannels of the M1 bits is determined according to a table or a sequence that represents reliability.

Optionally, the M bits corresponding to the M polarized subchannels with the relatively low reliability are determined based on a capacity (I(W)), or a reliability order of M1 polarized subchannels of the M1 bits is determined based on a capacity (I(W)).

Optionally, the M bits corresponding to the M polarized subchannels with the relatively low reliability are determined based on a Bhattacharyya parameter (Z(W)), or a reliability order of M1 polarized subchannels of the M1 bits is determined based on a Bhattacharyya parameter (Z(W)).

Optionally, the M bits corresponding to the M polarized subchannels with the relatively low reliability are determined based on an error probability (P(W)), or a reliability order of M1 polarized subchannels of the M1 bits is determined based on an error probability (P(W)).

Figure 10:
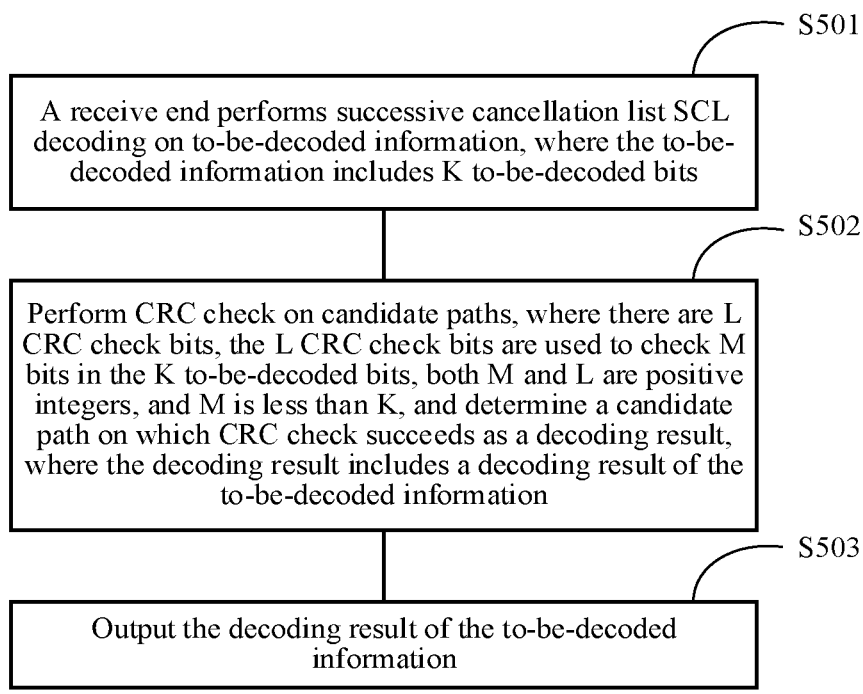
FIG. 10 is a basic flowchart of a method for decoding a polar code concatenated with a CRC code according to an embodiment of this application.

FIG. 10 is a basic flowchart of a method for decoding a polar code concatenated with a CRC code according to an embodiment of this application. The method includes the following steps.

5501: The receive end performs successive cancellation list (SCL) decoding on to-be-decoded information, where the to-be-decoded information includes K to-be-decoded bits.

5502: Perform CRC check on candidate paths, where there are L CRC check bits, the L CRC check bits are used to check M bits in the K to-be-decoded bits, both M and L are positive integers, and M is less than K; and determine a candidate path on which CRC check succeeds as a decoding result, where the decoding result includes a decoding result of the to-be-decoded information.

5503: Output the decoding result of the to-be-decoded information.

The M bits are determined based on reliability of K polarized subchannels on which the K bits are placed or row weights of K rows, in a first matrix, corresponding to the K polarized subchannels on which the K bits are placed, and the first matrix is an encoding matrix of polar encoding; or the M bits are determined based on reliability of K polarized subchannels on which the K bits are placed and row weights of K rows, in the first matrix, corresponding to the K polarized subchannels on which the K bits are placed, where N is 2 raised to the power of a positive integer, K is less than or equal to N, L is less than N, and (K+L) is less than or equal to N.

Optionally, the M bits are determined based on the row weights of the K rows, in the first matrix, corresponding to the K polarized subchannels on which the K bits are placed, and the M bits are bits corresponding to M rows with relatively small row weights in the K rows or in (K+L) rows. The first matrix is an encoding matrix of a polar code.

Optionally, the row weights of the M rows corresponding to the M bits are less than or equal to a first threshold. In a possible design, the first threshold is greater than or equal to a minimum value in the row weights of the K rows corresponding to the K bits. In another possible design, the first threshold is determined based on a minimum code distance of the polar code.

Optionally, the M bits are determined based on the reliability of the K polarized subchannels on which the K bits are placed. In a possible design, the M bits are M bits corresponding to M polarized subchannels with relatively low reliability in the K polarized subchannels on which the K bits are placed. CRC encoding is performed on bits with low channel reliability, and bits with high channel reliability are directly mapped to polarized subchannels. Compared with a conventional concatenation solution with a same CRC code length, this reduces a frame error rate.

Optionally, the M bits are determined based on the reliability of the K polarized subchannels on which the K bits are placed and the row weights of the K rows, in the first matrix, corresponding to the K polarized subchannels on which the K bits are placed. In a possible design, the step of determining the M bits includes: determining M1 bits corresponding to rows, in the first matrix, whose row weights are less than or equal to a first threshold, where M1 is greater than or equal to M, and M1 is a positive integer; and determining the M bits from the M1 bits, where the M bits are M bits corresponding to relatively low polarized subchannel reliability in the M1 bits.

Optionally, the M bits are determined based on the reliability of the K polarized subchannels on which the K bits are placed and the row weights of the K rows, in the first matrix, corresponding to the K polarized subchannels on which the K bits are placed. In a possible design, the step of determining the M bits includes: determining M2 bits from the K bits, where the M2 bits are M2 bits corresponding to relatively low polarized subchannel reliability in the K bits, M2 is greater than or equal to M, and M2 is a positive integer; and determining the M bits from the M2 bits, where row weights of M rows corresponding to the M bits are less than or equal to a second threshold.

Optionally, the M bits corresponding to the M polarized subchannels with the relatively low reliability are determined according to a table or a sequence that represents reliability, or a reliability order of M1 polarized subchannels of the M1 bits is determined according to a table or a sequence that represents reliability.

Optionally, the M bits corresponding to the M polarized subchannels with the relatively low reliability are determined based on a capacity (I(W)), or a reliability order of M1 polarized subchannels of the M1 bits is determined based on a capacity (I(W)).

Optionally, the M bits corresponding to the M polarized subchannels with the relatively low reliability are determined based on a Bhattacharyya parameter (Z(W)), or a reliability order of M1 polarized subchannels of the M1 bits is determined based on a Bhattacharyya parameter (Z(W)).

Optionally, the M bits corresponding to the M polarized subchannels with the relatively low reliability are determined based on an error probability (P(W)), or a reliability order of M1 polarized subchannels of the M1 bits is determined based on an error probability (P(W)).

Figure 11:
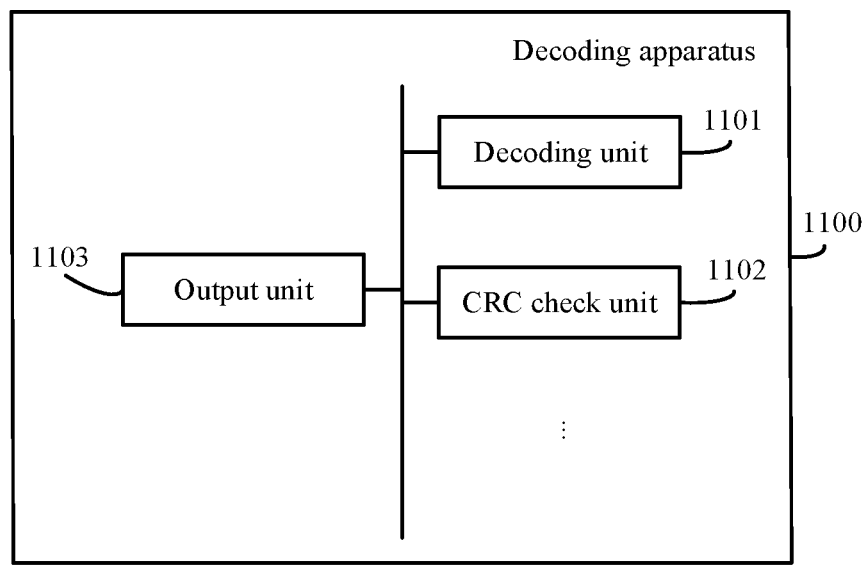
FIG. 11 is a schematic structural diagram of a decoding apparatus 1100 according to this application.

FIG. 11 is a schematic structural diagram of a decoding apparatus 1100 according to this application. The encoding apparatus 1100 includes: a decoding unit 1101 configured to perform SCL decoding on to-be-decoded information, where the to-be-decoded information includes K to-be-decoded bits; a CRC check unit 1102 configured to: perform CRC check on candidate paths, where there are L CRC check bits, the L CRC check bits are used to check M bits in the K bits, both M and L are positive integers, and M is less than K; and determine a candidate path on which CRC check succeeds as a decoding result, where the decoding result includes a decoding result of the to-be-decoded information; and an output unit 1103 configured to output the decoding result of the to-be-decoded information.

The M bits are determined based on reliability of K polarized subchannels on which the K bits are placed or row weights of K rows, in a first matrix, corresponding to the K polarized subchannels on which the K bits are placed, and the first matrix is an encoding matrix of polar encoding; or the M bits are determined based on reliability of K polarized subchannels on which the K bits are placed and row weights of K rows, in the first matrix, corresponding to the K polarized subchannels on which the K bits are placed, where N is 2 raised to the power of a positive integer, K is less than or equal to N, L is less than N, and (K+L) is less than or equal to N.

Optionally, row weights of M rows corresponding to the M bits are less than or equal to a first threshold. In a possible design, the first threshold is greater than or equal to a minimum value in the row weights of the K rows corresponding to the K bits. In another possible design, the first threshold is determined based on a minimum code distance of the polar code.

Optionally, the M bits are determined based on the reliability of the K polarized subchannels on which the K bits are placed. In a possible design, the M bits are M bits corresponding to M polarized subchannels with relatively low reliability in the K polarized subchannels on which the K bits are placed. CRC encoding is performed on bits with low channel reliability, and bits with high channel reliability are directly mapped to polarized subchannels. Compared with a conventional concatenation solution with a same CRC code length, this reduces a frame error rate.

Optionally, the M bits are determined based on the reliability of the K polarized subchannels on which the K bits are placed and the row weights of the K rows, in the first matrix, corresponding to the K polarized subchannels on which the K bits are placed. In a possible design, the step of determining the M bits includes: determining M1 bits corresponding to rows, in the first matrix, whose row weights are less than or equal to a first threshold, where M1 is greater than or equal to M, and M1 is a positive integer; and determining the M bits from the M1 bits, where the M bits are M bits corresponding to relatively low polarized subchannel reliability in the M1 bits.

Optionally, the M bits are determined based on the reliability of the K polarized subchannels on which the K bits are placed and the row weights of the K rows, in the first matrix, corresponding to the K polarized subchannels on which the K bits are placed. In a possible design, the step of determining the M bits includes: determining M2 bits from the K bits, where the M2 bits are M2 bits corresponding to relatively low polarized subchannel reliability in the K bits, M2 is greater than or equal to M, and M2 is a positive integer; and determining the M bits from the M2 bits, where row weights of M rows corresponding to the M bits are less than or equal to a second threshold.

Optionally, the M bits corresponding to the M polarized subchannels with the relatively low reliability are determined according to a table or a sequence that represents reliability, or a reliability order of M1 polarized subchannels of the M1 bits is determined according to a table or a sequence that represents reliability.

Optionally, the M bits corresponding to the M polarized subchannels with the relatively low reliability are determined based on a capacity (I(W)), or a reliability order of M1 polarized subchannels of the M1 bits is determined based on a capacity (I(W)).

Optionally, the M bits corresponding to the M polarized subchannels with the relatively low reliability are determined based on a Bhattacharyya parameter (Z(W)), or a reliability order of M1 polarized subchannels of the M1 bits is determined based on a Bhattacharyya parameter (Z(W)).

Optionally, the M bits corresponding to the M polarized subchannels with the relatively low reliability are determined based on an error probability (P(W)), or a reliability order of M1 polarized subchannels of the M1 bits is determined based on an error probability (P(W)).

Figure 12:
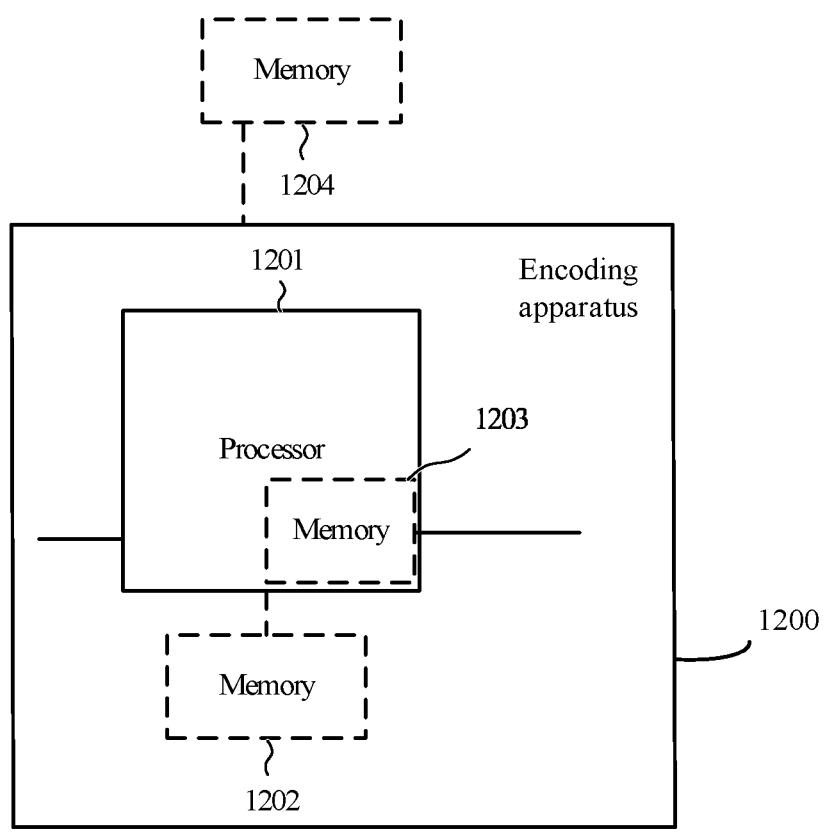
FIG. 12 is a schematic structural diagram of another encoding apparatus 1200 according to this application.

A part or all of the encoding method in the foregoing embodiments may be implemented by hardware or software. When the method is implemented by software, FIG. 12 is a schematic structural diagram of another encoding apparatus 1200 according to this application. The encoding apparatus 1200 includes: a processor 1201 configured to execute a program stored in a memory 1202, a memory 1203, or a memory 1204, where when the program is executed, the apparatus is enabled to perform the encoding method in any one of the foregoing embodiments.

Alternatively, the memory 1202, the memory 1203, or the memory 1204 may store data generated or used in a process in which the processor performs the encoding method. For example, the memory is a cache. The memory may be a physically independent unit, or may be storage space, a network hard disk, or the like on a cloud server.

Optionally, the memory 1202 is located in the apparatus.

Optionally, the memory 1203 is integrated with the processor 1201.

Optionally, the memory 1204 is located outside the apparatus.

Optionally, the apparatus is a base station or a terminal.

Optionally, the apparatus is a chip or an integrated circuit.

The processor 1201 may be a central processing unit (CPU), a network processor (NP), or a combination of a CPU and an NP.

Alternatively, the processor 1201 may be a hardware chip, an application-specific integrated circuit (ASIC), a programmable logic device (PLD), or a combination thereof. The PLD may be a complex programmable logic device (CPLD), a field-programmable gate array (FPGA), a generic array logic (GAL), or any combination thereof.

The memory (or a storage unit) in this embodiment of this application may include a volatile memory, for example, a random-access memory (RAM). The memory may also include a non-volatile memory, for example, a flash memory, a hard disk drive (HDD), a solid-state drive (SSD), cloud storage, network attached storage (NAS), and a network drive. The memory may further include a combination of the foregoing types of memories or another medium or product, in any form, that has a storage function.

Optionally, the apparatus is a base station or a terminal.

Optionally, the apparatus is a chip or an integrated circuit.

Figure 13:
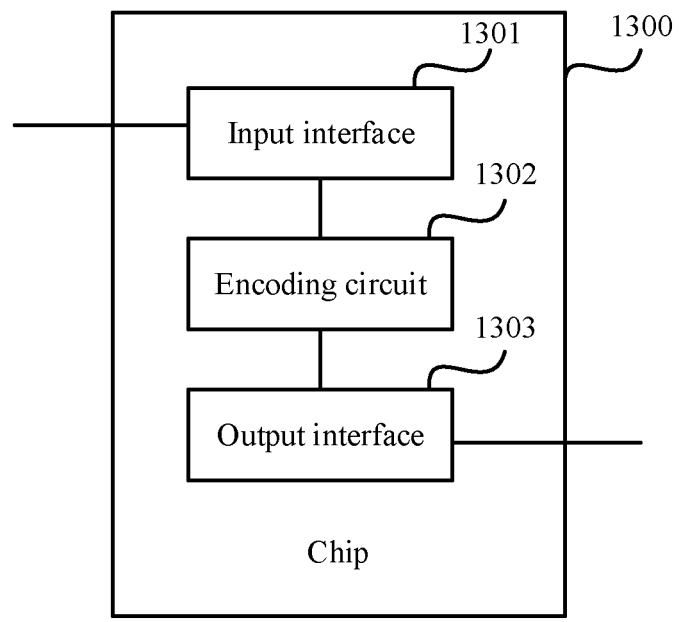
FIG. 13 is a schematic structural diagram of a chip 1300 according to this application.

FIG. 13 is a schematic structural diagram of a chip 1300 according to this application. The chip 1300 includes: an input interface 1301 configured to obtain a bit sequence whose length is K, where the bit sequence includes K bits, and K is a positive integer; an encoding circuit 1302 configured to perform CRC encoding on M bits in the K bits to obtain L CRC check bits, where both M and L are positive integers, and M is less than K, where the encoding circuit 1302 is further configured to perform polar encoding on the K bits and the L CRC check bits to obtain an encoded codeword whose length is N, where an encoding matrix of the polar encoding is a first matrix, and the M bits are determined based on reliability of K polarized subchannels on which the K bits are placed or row weights of K rows, in the first matrix, corresponding to the K polarized subchannels on which the K bits are placed, or the M bits are determined based on reliability of K polarized subchannels on which the K bits are placed and row weights of K rows, in the first matrix, corresponding to the K polarized subchannels on which the K bits are placed, where N is 2 raised to the power of a positive integer, K is less than or equal to N, L is less than N, and (K+L) is less than or equal to N; and an output interface 1303 configured to output the encoded codeword.

Optionally, the M bits are determined based on the row weights of the K rows, in the first matrix, corresponding to the K polarized subchannels on which the K bits are placed, and the M bits are bits corresponding to M rows with relatively small row weights in the K rows or in (K+L) rows.

Optionally, the row weights of the M rows corresponding to the M bits are less than or equal to a first threshold.

Optionally, the first threshold is greater than or equal to a minimum value in the row weights of the K rows corresponding to the K bits.

Optionally, the M bits are determined based on the reliability of the K polarized subchannels on which the K bits are placed, and more specifically, the M bits are M bits corresponding to M polarized subchannels with relatively low reliability in the K polarized subchannels on which the K bits are placed.

Optionally, the M bits are determined based on the reliability of the K polarized subchannels on which the K bits are placed and the row weights of the first matrix, and the step of determining the M bits includes: determining M1 bits corresponding to rows, in the first matrix, whose row weights are less than or equal to a first threshold, where M1 is greater than or equal to M; and determining the M bits from the M1 bits, where the M bits are M bits corresponding to relatively low polarized subchannel reliability in the M1 bits.

Optionally, the M bits are determined based on the reliability of the K polarized subchannels on which the K bits are placed and the row weights of the first matrix, and the step of determining the M bits includes: determining M2 bits from the K bits, where the M2 bits are M2 bits corresponding to relatively low polarized subchannel reliability in the K bits, and M2 is greater than or equal to M; and determining the M bits from the M2 bits, where row weights of M rows corresponding to the M bits are less than or equal to a second threshold.

An embodiment of this application further provides a communications system. The communications system includes a network device and a terminal, and the network device or the terminal may perform the encoding method in the foregoing embodiments.

An embodiment of this application further provides a wireless device, including an encoding apparatus and a transceiver that are configured to implement the foregoing embodiments. The modulator is configured to modulate a processed encoded codeword to obtain a modulated codeword. The transceiver is configured to send the modulated codeword.

Optionally, the wireless device is a terminal or a network device.

Figure 14:
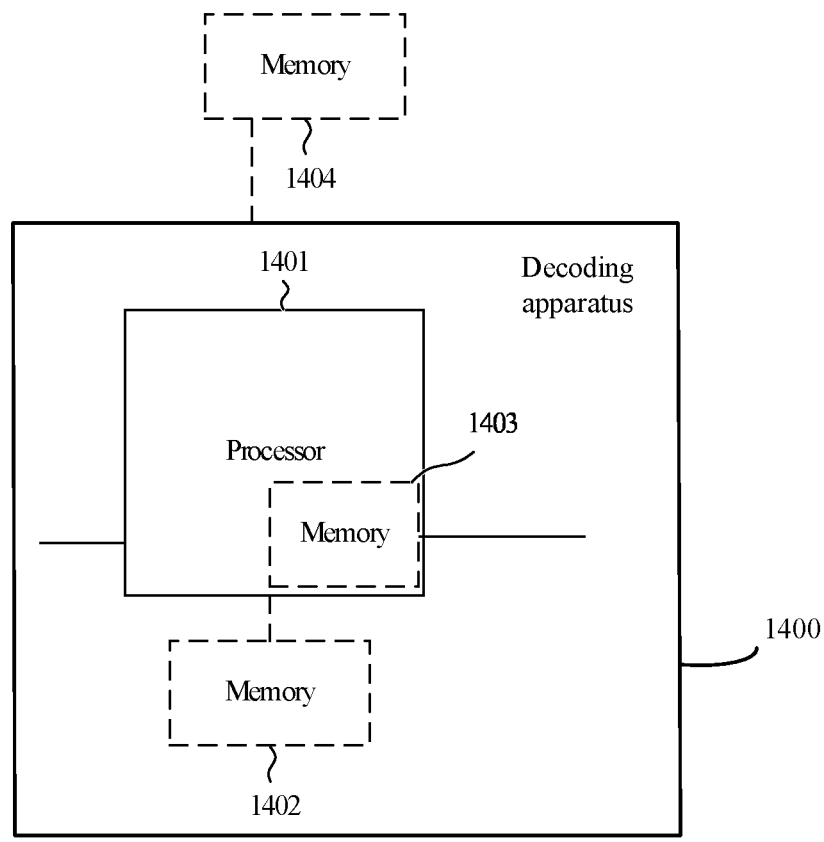
FIG. 14 is a schematic structural diagram of another decoding apparatus 1400 according to this application.

A part or all of the decoding method in the foregoing embodiments may be implemented by hardware or software. When software is used for implementation, FIG. 14 is a schematic structural diagram of another decoding apparatus 1400 according to this application. The decoding apparatus 1400 includes: a processor 1401 configured to execute a program stored in a memory 1402, a memory 1403, or a memory 1404, where when the program is executed, the apparatus is enabled to perform the decoding method in any one of the foregoing embodiments.

Alternatively, the memory 1402, the memory 1403, or the memory 1404 may store data generated or used in a process in which the processor performs the decoding method. The memory may be a physically independent unit, or may be storage space, a network hard disk, or the like on a cloud server. For example, the memory is a cache or a cloud disk.

Optionally, the memory 1402 is located in the apparatus.

Optionally, the memory 1403 is integrated with the processor 1401.

Optionally, the memory 1404 is located outside the apparatus.

Optionally, the apparatus is a base station or a terminal.

Optionally, the apparatus is a chip or an integrated circuit.

The processor 1401 may be a CPU, an NP), or a combination of a CPU and an NP.

Alternatively, the processor 1401 may be a hardware chip, an ASIC, a PLD, or a combination thereof. The PLD may be a CPLD, an FPGA, a GAL, or any combination thereof.

The memory (or a storage unit) in this embodiment of this application may include a volatile memory, for example, a random-access memory (RAM). The memory may also include a non-volatile memory, for example, a flash memory, a hard disk drive (HDD), a solid-state drive (SSD), cloud storage, network attached storage, and a network drive. The memory may further include a combination of the foregoing types of memories or another medium or product, in any form, that has a storage function.

Optionally, the apparatus is a base station or a terminal.

Optionally, the apparatus is a chip or an integrated circuit.

An embodiment of this application further provides a communications system. The communications system includes a network device and a terminal. The network device or the terminal may perform the decoding method in the foregoing embodiments.

An embodiment of this application further provides a wireless device, including a decoding apparatus, a demodulator, and a transceiver that are configured to implement the foregoing embodiments. The transceiver receives a modulated codeword. The demodulator is configured to demodulate the modulated codeword to obtain to-be-decoded information.

Optionally, the wireless device is a terminal or a network device.

An embodiment of this application further provides a computer-readable storage medium. The computer-readable storage medium stores a computer program instruction. When the computer program instruction is executed by a computer, the decoding method in any one of the foregoing embodiments is implemented.

An embodiment of this application further provides a computer program product. When the computer program product runs on a computer, the computer is enabled to perform the decoding method in any one of the foregoing embodiments.

An embodiment of this application further provides a system chip. The system chip includes a processing unit and a communications unit. The processing unit may be, for example, a processor. The communications unit may be, for example, an input/output interface, a pin, a circuit, or the like. The processing unit may execute a computer instruction, such that a chip in the communications apparatus performs any method provided in the foregoing embodiments of this application.

One or more of the foregoing modules or units may be implemented by software, hardware, or a combination thereof. When any one of the foregoing modules or units is implemented by software, the software exists in a form of a computer program instruction, and is stored in a memory. The processor may be configured to execute the program instruction to implement the foregoing method procedures. The processor may include but is not limited to at least one of the following computing devices that run various types of software: a CPU, a microprocessor, a digital signal processor (DSP), a microcontroller unit (MCU), an artificial intelligence processor, or the like. Each computing device may include one or more cores configured to perform an operation or processing by executing a software instruction. The processor may be embedded in a system-on-a-chip (SoC) or an ASIC, or may be an independent semiconductor chip. The processor includes a core configured to perform an operation or processing by executing a software instruction, and may further include a necessary hardware accelerator, for example, an FPGA, a PLD, or a logic circuit that implements a dedicated logic operation.

When the foregoing modules or units are implemented by hardware, the hardware may be any one or any combination of a CPU, a microprocessor, a DSP, an MCU, an artificial intelligence processor, an ASIC, an SoC, an FPGA, a PLD, a dedicated digital circuit, a hardware accelerator, or a non-integrated discrete device, and the hardware may run necessary software or does not depend on software, to perform the foregoing method procedures.

Although this application is described with reference to example features and the embodiments thereof, clearly, various modifications and combinations may be made to them without departing from the spirit and scope of this application. Correspondingly, the specification and accompanying drawings are merely example description of this application defined by the appended claims, and are considered as any of or all modifications, variations, combinations or equivalents that cover the scope of this application. Clearly, a person skilled in the art can make various modifications and variations to this application without departing from the spirit and scope of this application. This application is intended to cover these modifications and variations of this application provided that they fall within the scope of protection defined by the following claims and their equivalent technologies.

What is claimed is:

1. An encoding method comprising:
   obtaining a bit sequence comprising K bits, wherein K is a positive integer;
   performing cyclic redundancy check (CRC) encoding on M bits in the K bits to obtain L CRC check bits, wherein both M and L are positive integers, and wherein M is less than K;
   performing polar encoding on the K bits and the L CRC check bits to obtain an encoded codeword whose length is N, wherein an encoding matrix of the polar encoding is a first matrix, wherein the M bits are based on a reliability of K polarized subchannels on which the K bits are placed and row weights of K rows in the first matrix, wherein the K rows correspond to the K polarized subchannels on which the K bits are placed, wherein N is 2 raised to a power of a positive integer, wherein K is less than or equal to N, wherein L is less than N, and wherein (K+L) is less than or equal to N; and
   outputting the encoded codeword.

2. The encoding method according to claim 1, wherein the M bits correspond to M rows with relatively small row weights in the K rows or in (K+L) rows.

3. The encoding method according to claim 2, wherein the row weights of the M rows corresponding to the M bits are less than or equal to a first threshold.

4. The encoding method according to claim 3, wherein the first threshold is greater than or equal to a minimum value in the row weights of the K rows corresponding to the K bits.

5. The encoding method according to claim 1, wherein the M bits are further based on M bits corresponding to M polarized subchannels with relatively low reliability in the K polarized subchannels on which the K bits are placed.

6. The encoding method according to claim 1, wherein the M bits are further based on the reliability of the K polarized subchannels on which the K bits are placed and the row weights of the K rows in the first matrix.

7. The encoding method according to claim 6, further comprising determining the M bits by determining M1 bits corresponding to rows in the first matrix whose row weights are less than or equal to a first threshold, wherein M1 is greater than or equal to M, and wherein M1 is a positive integer.

8. The encoding method according to claim 7, wherein determining the M bits further comprises determining the M bits from the M1 bits, wherein the M bits correspond to relatively low polarized subchannel reliability in the M1 bits.

9. The encoding method according to claim 8, wherein determining the M bits further comprises:
   determining M2 bits from the K bits, wherein the M2 bits correspond to relatively low polarized subchannel reliability in the K bits, wherein M2 is greater than or equal to M, and wherein M2 is a positive integer; and
   determining the M bits from the M2 bits, wherein row weights of M rows corresponding to the M bits are less than or equal to a second threshold.

10. An encoding apparatus comprising:
    an obtaining processor configured to obtain a bit sequence whose length is K, wherein the bit sequence comprises K bits, and K is a positive integer;
    a CRC encoder configured to perform CRC encoding on M bits in the K bits to obtain L CRC check bits, wherein both M and L are positive integers, and M is less than K;
    a polar encoder configured to perform polar encoding on the K bits and the L CRC check bits to obtain an encoded codeword whose length is N, wherein an encoding matrix of the polar encoding is a first matrix, and wherein the M bits are based on reliability of K polarized subchannels on which the K bits are placed and row weights of K rows in the first matrix, wherein the K rows correspond to the K polarized subchannels on which the K bits are placed, wherein N is 2 raised to a power of a positive integer, wherein K is less than or equal to N, wherein L is less than N, and wherein (K+L) is less than or equal to N; and
    an output processor configured to output the encoded codeword.

11. The encoding apparatus according to claim 10, wherein the M bits correspond to M rows with relatively small row weights in the K rows or in (K+L) rows.

12. The encoding apparatus according to claim 11, wherein the row weights of the M rows corresponding to the M bits are less than or equal to a first threshold.

13. The encoding apparatus according to claim 12, wherein the first threshold is greater than or equal to a minimum value in the row weights of the K rows corresponding to the K bits.

14. The encoding apparatus according to claim 10, wherein the M bits are further based on M bits corresponding to M polarized subchannels with relatively low reliability in the K polarized subchannels on which the K bits are placed.

15. The encoding apparatus according to claim 10, wherein the M bits are further based on the reliability of the K polarized subchannels on which the K bits are placed and the row weights of the K rows in the first matrix.

16. The encoding apparatus according to claim 15, wherein the polar encoder is further configured to determine the M bits by determining M1 bits corresponding to rows in the first matrix whose row weights are less than or equal to a first threshold, wherein M1 is greater than or equal to M, and wherein M1 is a positive integer.

17. The encoding apparatus according to claim 16, wherein the polar encoder is further configured to further determine the M bits by determining the M bits from the M1 bits, wherein the M bits correspond to relatively low polarized subchannel reliability in the M1 bits.

18. The encoding apparatus according to claim 17, wherein the polar encoder is further configured to further determine the M bits by:
    determining M2 bits from the K bits, wherein the M2 bits correspond to relatively low polarized subchannel reliability in the K bits, wherein M2 is greater than or equal to M, and wherein M2 is a positive integer; and
    determining the M bits from the M2 bits, wherein row weights of M rows corresponding to the M bits are less than or equal to a second threshold.

19. An encoding apparatus comprising:
    a memory configured to store instructions; and
    a processor coupled to the memory and configured to execute the instructions to cause the encoding apparatus to:
       obtain a bit sequence comprising K bits, wherein K is a positive integer;
       perform cyclic redundancy check (CRC) encoding on M bits in the K bits to obtain L CRC check bits, wherein both M and L are positive integers, and wherein M is less than K;
       perform polar encoding on the K bits and the L CRC check bits to obtain an encoded codeword whose length is N, wherein an encoding matrix of the polar encoding is a first matrix, wherein the M bits are based on a reliability of K polarized subchannels on which the K bits are placed and row weights of K rows in the first matrix, wherein the K rows correspond to the K polarized subchannels on which the K bits are placed, wherein N is 2 raised to a power of a positive integer, wherein K is less than or equal to N, wherein L is less than N, and wherein (K+L) is less than or equal to N; and
       output the encoded codeword.

20. The encoding apparatus according to claim 19, wherein the memory is located outside the encoding apparatus.

* * * * *